(12) United States Patent
Sameshima et al.

(10) Patent No.: US 8,052,337 B2
(45) Date of Patent: Nov. 8, 2011

(54) OPTICAL MODULE

(75) Inventors: Hiroshi Sameshima, Nara (JP); Takayoshi Koike, Hirakata (JP); Naru Yasuda, Uji (JP); Hayami Hosokawa, Kyoto (JP); Hiroto Nozawa, Yokohama (JP)

(73) Assignee: OMRON Corporation, Kyoto (JP)

( * ) Notice: Subject to any disclaimer, the term of this patent is extended or adjusted under 35 U.S.C. 154(b) by 81 days.

(21) Appl. No.: 12/158,721

(22) PCT Filed: Dec. 28, 2006

(86) PCT No.: PCT/JP2006/326277
§ 371 (c)(1),
(2), (4) Date: Nov. 12, 2008

(87) PCT Pub. No.: WO2007/074911
PCT Pub. Date: Jul. 5, 2007

(65) Prior Publication Data
US 2009/0202199 A1  Aug. 13, 2009

(30) Foreign Application Priority Data
Dec. 28, 2005  (JP) .................. 2005-378126

(51) Int. Cl.
*G02B 6/36* (2006.01)
*G02B 6/42* (2006.01)
(52) U.S. Cl. .......................... 385/94; 385/88
(58) Field of Classification Search .......... 385/94
See application file for complete search history.

(56) References Cited

U.S. PATENT DOCUMENTS
4,092,061 A * 5/1978 Stigliani, Jr. ............. 385/33
(Continued)

FOREIGN PATENT DOCUMENTS
EP  0864893 A2  9/1998
(Continued)

OTHER PUBLICATIONS
International Search Report w/English translation from PCT/JP2006/326277 dated Jan. 25, 2007 (4 pages).
(Continued)

*Primary Examiner* — Michelle R Connelly Cushwa
(74) *Attorney, Agent, or Firm* — Osha • Liang LLP

(57) ABSTRACT

An optical module (1) including a light receiving/emitting element (3) for transmitting or receiving an optical signal, an optical waveguide (2) having a core part made of a material with translucency and a clad part made of a material having an index of refraction different from an index of refraction of the core part for optically coupling with the light receiving/emitting element (3) and transmitting the optical signal, and a package (5) for accommodating at least one end including an entrance/exit port (2c) of the optical signal in the optical waveguide (2) and the light receiving/emitting element (3); wherein a surface on a side facing a bottom plate mounted with the light receiving/emitting element (3) in the package (5) at the end of the optical waveguide (2) accommodated in the package (5) is configured by a first region including a portion projected into a space inside the package (5), and a second region different from the first region; and the package (5) includes a supporting part (5a) for supporting one part of at least one side of the surface forming the first region in the first region, and supporting one part of at least two sides of the surface forming the second region in the second region.

10 Claims, 22 Drawing Sheets

U.S. PATENT DOCUMENTS

| | | | | |
|---|---|---|---|---|
| 5,073,003 A * | 12/1991 | Clark | | 385/33 |
| 5,880,525 A * | 3/1999 | Boudreau et al. | | 257/752 |
| 6,491,447 B2 * | 12/2002 | Aihara | | 385/92 |
| 6,722,793 B2 * | 4/2004 | Althaus et al. | | 385/92 |
| 6,739,764 B2 * | 5/2004 | Ido et al. | | 385/92 |
| 6,813,418 B1 * | 11/2004 | Kragl | | 385/49 |
| 6,821,027 B2 * | 11/2004 | Lee et al. | | 385/89 |
| 6,843,607 B2 * | 1/2005 | Nakanishi et al. | | 385/92 |
| 6,848,839 B2 * | 2/2005 | Steinberg | | 385/88 |
| 6,945,712 B1 * | 9/2005 | Conn | | 385/94 |
| 6,965,714 B2 * | 11/2005 | Brock et al. | | 385/33 |
| 7,162,127 B2 * | 1/2007 | Ohtsu et al. | | 385/49 |
| 7,189,007 B2 * | 3/2007 | Imanbayev et al. | | 385/77 |
| 7,254,301 B2 * | 8/2007 | Hoshino et al. | | 385/52 |
| 7,404,679 B2 * | 7/2008 | Ebbutt et al. | | 385/78 |
| 7,547,151 B2 * | 6/2009 | Nagasaka | | 385/93 |
| 7,657,140 B2 * | 2/2010 | Okuno et al. | | 385/49 |
| 2002/0181882 A1 * | 12/2002 | Hibbs-Brenner et al. | | 385/52 |
| 2003/0123819 A1 * | 7/2003 | Nakanishi et al. | | 385/92 |
| 2003/0179539 A1 | 9/2003 | Yang | | |
| 2004/0208416 A1 * | 10/2004 | Chakravorty et al. | | 385/14 |
| 2006/0210225 A1 * | 9/2006 | Fujiwara et al. | | 385/92 |

FOREIGN PATENT DOCUMENTS

| | | |
|---|---|---|
| JP | 6-82660 A | 3/1994 |
| JP | 10-123372 A | 5/1998 |
| JP | 11-202145 A | 7/1999 |
| JP | 2003-222746 A | 8/2003 |
| JP | 2003-302544 A | 10/2003 |
| JP | 2004-21042 A | 1/2004 |
| JP | 2006-208794 A | 8/2006 |
| WO | 00/42463 A1 | 7/2000 |
| WO | 01/18580 A1 | 3/2001 |

OTHER PUBLICATIONS espacenet Abstract of JP6082660; Hitachi Ltd. published on Mar. 25, 1994 (1 page).

espacenet Abstract of JP10123372; Fujitsu Ltd. published on May 15, 1998 (1 page).

espacenet Abstract of JP11202145; Nippon Telegraph & Telephone published on Jul. 30, 1999 (1 page).

espacenet Abstract of JP2003222746; Mitsubishi Electric Corp. published on Aug. 8, 2003 (1 page).

espacenet Abstract of JP2003302544; Mitsui Chemicals Inc. published on Oct. 24, 2003 (1 page).

espacenet Abstract of JP2004021042; Mitsui Chemicals Inc. published on Jan. 22, 2004 (1 page).

espacenet Abstract of JP2006208794; Fuji Xerox Co. Ltd. published Aug. 10, 2006 (1 page).

European Search Report in European Application No. 06843655.9 dated Nov. 19, 2009, 7 pages.

Patent Abstracts of Japan, Publication No. 2000010030, Publication Date Jan. 14, 2000, 1 page.

\* cited by examiner

OPTICAL MODULE

TECHNICAL FIELD

The present invention relates to an optical communication cable module, and in particular, to a package in an optical cable having flexibility.

BACKGROUND ART

In recent years, in particular, there has been a demand for realizing a flexible optical wiring to be mounted (similar to electrical wiring) on bendable displays and more compact and thin commercial-off-the-shelf equipments with an optical waveguide.

In applications such as portable terminal, in particular, there has been desired a new wiring capable of forming patterns such as the conventional FPC (printed circuit board), and having flexibility (particularly twistability) and noise-resistance property such as coaxial cable, and in that sense, there has been desired a new wiring which uses a bendable, twistable, and flexible film-type optical waveguide.

The optical waveguide is formed by a core having a large index of refraction, and a clad having a small index of refraction arranged contacting the periphery of the core, and is made to propagate an optical signal entered to the core while repeating total reflection at the boundary of the core and the clad.

There is a need to align with and optically couple with a photoelectric conversion element (light receiving/emitting element) to transmit optical data using the optical waveguide. The light receiving/emitting element converts an electric signal to an optical signal and transmits the optical signal, and receives the optical signal and converts the optical signal to the electric signal. In order to maintain the optically coupled state, the distance and the position relationship of a receiving/transmitting part of the optical signal in the light receiving/emitting element and an entrance/exit port of the optical signal in the optical waveguide need to be maintained constant with the optical cable fixed.

Conventionally various methods have been proposed to fix the optical cable to optically couple the optical cable and the light receiving/emitting element.

For instance, when using an optical fiber for the optical cable, there is adopted a method of attaching a holding member (ferrule) at an end of the optical fiber and fixing the holding member to a package. The entrance/exit port of the optical signal in the optical fiber is thereby fixed, and the optically coupled state can be maintained.

When using an optical waveguide for the optical cable, there is adopted a method of forming an insertion hole in a package, and directly inserting the optical waveguide into the insertion hole to be fixed to the package. One example of this method is described in patent document 1. The conventionally used optical waveguide has rigidity compared to the film-type optical waveguide, and thus a holding member such as ferrule is unnecessary, and the structure thereof is not described.

FIG. 30 is a perspective view showing a schematic configuration of an optical module 100 described in patent document 1, and FIG. 31 is a perspective view showing a schematic configuration of a package of the optical module 100. As shown in FIG. 31, an insertion port 103 is formed in a package 101 to insert an optical waveguide 102. The optical waveguide 102 is inserted to the insertion part 103 and fixed so that a semiconductor laser (light receiving/emitting element) 104 arranged inside the package 101 and the optical waveguide 102 optically couple. The distance and the position relationship of the optical waveguide 102 and the light receiving/emitting element 104 are thereby maintained constant.

A method of fixing the optical waveguide when using an optical waveguide having high flexibility for the optical cable is disclosed in patent documents 2 and 3. Specifically, the optical waveguide is directly fixed to the light receiving/emitting element using an adhering member such as adhesive.

Patent document 1: Japanese Laid-Open Patent Publication No. 6-82660 (Published Mar. 25, 1994)

Patent document 2; Japanese Laid-Open Patent Publication No. 2003-302544 (Published Oct. 24, 2003)

Patent document 3: Japanese Laid-Open Patent Publication No. 2004-21042 (Published Jan. 22, 2004)

The conventional configurations described above have the following problems.

The method of fixing the optical waveguide with the holding member such as ferrule used as a connecting technique of a rigid optical waveguide is methodically difficult when using a very flexible optical waveguide due to its flexibility. Consideration is made in reinforcing the flexible optical waveguide with a rigid member, but a problem arises in the optical system, in which a 45 degrees mirror and the like are arranged, in that the outer shape of the distal end becomes large thereby shielding the optical path, and realization of a low height module becomes difficult particularly for the commercial-off-the-shelf equipments such as information terminal.

In the method described in patent document 1, the optical waveguide is fixed only by a side wall in a direction traversing the optical waveguide in the package, and an end of the optical waveguide projected to the inside of the package is not fixed, and thus the end of the optical waveguide deforms, and warp or the like occurs in a situation where the usage environment of the optical module changes by heat generation of peripheral components, external force of vibration/drop, and the like. As a result, the distance between the receiving/transmitting part of the optical signal in the light receiving/emitting element and the entrance/exit port of the optical signal in the optical-waveguide, as well as the position relationship in XYZ directions change, and the optical coupling efficiency fluctuates.

In particular, polymer waveguide is often used when using the film-type optical waveguide having high flexibility, in which case the coefficient of thermal expansion is large and the coefficient is constituted by the core and the clad having different flexibilities, and thus has a property of being susceptible to heat.

In the methods described in patent documents 2 and 3, a height direction becomes large and miniaturization becomes difficult since the light receiving/emitting element and the optical waveguide are directly joined with adhesive.

In view of the various problems described above, it is an object of the present invention to provide an optical module capable of achieving miniaturization and capable of suppressing fluctuation of optical coupling efficiency.

DISCLOSURE OF THE INVENTION

In order to solve the above problems, an optical module of the present invention relates to an optical module including an optical element for transmitting or receiving an optical signal, an optical waveguide having a core part made of a material with translucency and a clad part made of a material having an index of refraction different from an index of refraction of the core part for optically coupling with the optical element and transmitting the optical signal, and a package for accommodating at least one end including an entrance/exit port of the optical signal in the optical waveguide and the optical element; wherein a surface on a side facing a bottom plate mounted with the optical element in the package at the end of the optical waveguide accommodated in the package is configured by a first region including a portion projected into a space inside the package, and a second region different from the first region; and the package includes a supporting part for supporting one part of at least one side of the surface forming the first region in the first region while supporting one part of at least two sides of the surface forming the second region in the second region.

The optical waveguide is configured by a core part having a large index of refraction and a clad part having a small index of refraction arranged at the periphery of the core part, and is made to propagate an optical signal entered to the core part while repeating total reflection at the boundary of the core part and the clad part.

According to such configuration, at the end of the optical waveguide including a first region and a second region configuring a surface facing the bottom plate of the package mounted with the optical element, one part of at least one side of the surface forming the first region is supported in the first region including the portion projected to the space inside the package, and one part of at least two sides of the surface forming the second region is supported in the second region.

When supporting the end of the optical waveguide only in a direction traversing the optical waveguide as in the related art, specifically, when supporting the end of the optical waveguide with only the side wall in the direction traversing the optical waveguide in the package at the opened surface of the package formed to a concave shape by the side walls rising from the bottom plate, that is, when supporting the end with only the second region of the waveguide, the distal end of the optical waveguide is not supported, and thus warp or the like occurs at the distal end of the optical waveguide by heat, external force, or the like.

As a countermeasure therefore, consideration is made in fixing both ends of the optical waveguide that are projected. However, when attempting to ensure a stable adhering area of the optical waveguide, in view of the mounting precision of the optical element to couple and the mounting precision of the optical waveguide, to fix both ends of the optical waveguide, the interval of the supporting part at both ends is widened and the width of the waveguide to be mounted thereon also needs to be widened, whereby the twistability of the film-type optical waveguide significantly lowers.

This problem is significant when performing a bi-directional communication. That is, when performing a bidirectional communication, a plurality of cores is formed in one optical waveguide in the rigid optical waveguide proposed in the optical interconnection of the equipment of the related art, but in this case, the width of one optical waveguide becomes wide. and sufficient twistability cannot be obtained, and thus the twistability needs to be realized by forming two optical waveguides between the transmission/reception modules, and narrowing the width of one waveguide. Thus, when arranging the supporting part on both sides (in width direction) of the respective optical waveguide, the two optical waveguides need to be sufficiently spaced apart, similar to the reason described above. Thus the outer shape of the optical module not only undesirably enlarges, but the distance between the light emitting element and the light receiving element, and the IC incorporating the drive circuit and the amplification circuit cannot be brought close, and the risk of signal degradation in the electric circuit significantly increases.

In the above described configuration, the region of the distal end of the optical waveguide, that is, the first region is supported, and thus deformation of the end of the optical waveguide caused by change in the usage environment temperature of the optical module, heat generation of peripheral components, external force of vibration/drop, and the like is suppressed, compared to the conventional configuration. Therefore, the distance and the position relationship between the entrance/exit port of the optical signal in the end of the optical waveguide and the optical element can be maintained constant, and the optical coupling efficiency can be maintained constant.

Since only the end on one side of the optical waveguide can be supported, the degree of freedom of wiring (wire) connecting the optical element and the IC can be increased, and thus the degree of freedom of the mounting position of electronic components such as optical element and IC increases without causing degradation of signal noise, and a satisfactory space-saving circuit design can be realized.

Furthermore, the interval of the optical waveguide can be narrowed regardless of whether or not the supporting part is included even when using a plurality of optical waveguides as in bi-directional communication, and the bi-directional communication function can be compactly realized.

Thus, miniaturization of the optical can be realized and fluctuation of the optical coupling efficiency can be suppressed without complicating the structure of the optical module, that is, with a simple configuration of supporting at least one part of the distal end of the optical waveguide.

Other objects, features, and excelling aspects of the present invention may best be understood by reference to the following description. The benefit of the present invention should be apparent in the following description together with the accompanying drawings.

BRIEF DESCRIPTION OF THE DRAWINGS

FIG. 1 (*b*) is an enlarged view of an end of an optical waveguide in the optical module shown in FIG. 1(*a*).

FIG. 1 (*c*) is a side view showing a schematic configuration of the optical module shown in FIG. 1 (*a*).

| DESCRIPTION OF SYMBOLS | |
|---|---|
| 1 | optical module |
| 2 | optical waveguide |
| 2c | entrance/exit port |
| 3 | light receiving/emitting element (optical element) |
| 4 | bonding wire |
| 5 | package |
| 5a | opened surface (supporting part) |
| 5b | groove part |
| 5c | lid (supporting part) |
| 6 | supporting column (supporting part) |
| 8 | sealant |

Best Mode For Carrying Out The Invention

One embodiment of the present invention will be described below using FIG. 1 to FIG. 29.

Figure 1A:
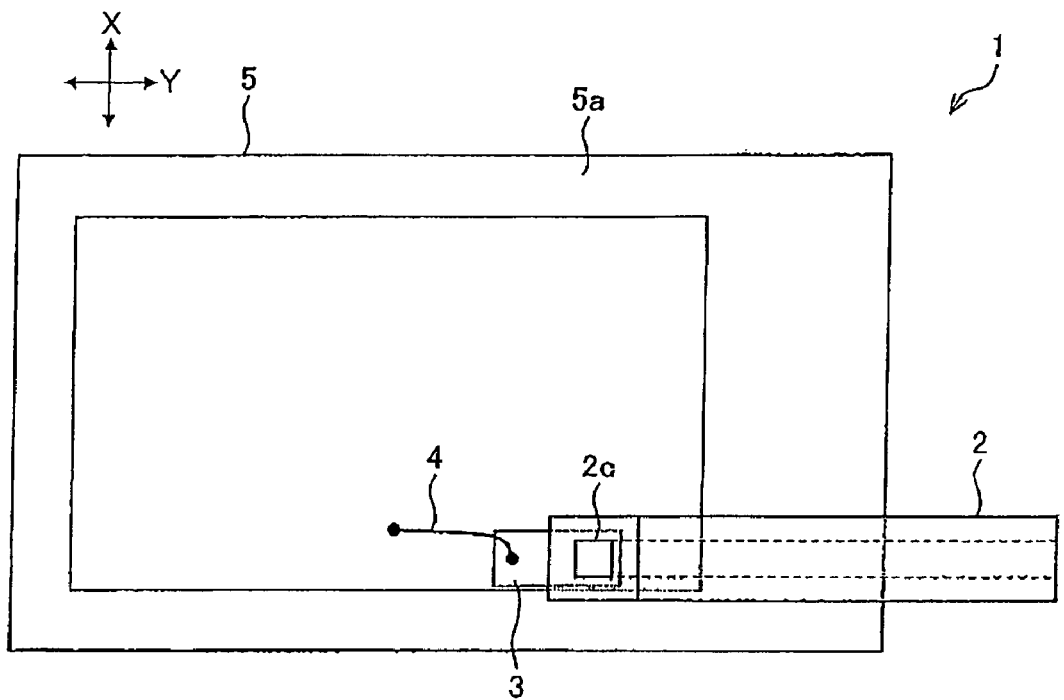
FIG. 1 (*a*) is a plan view showing a schematic configuration of an optical module according to the present embodiment.
Figure 1B:
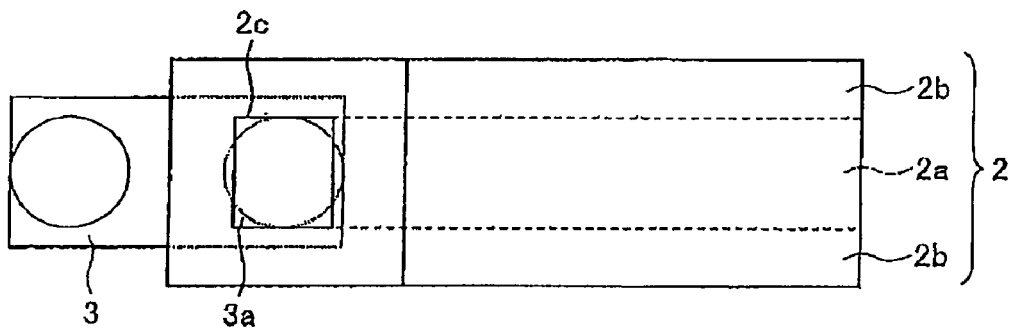
Figure 1C:
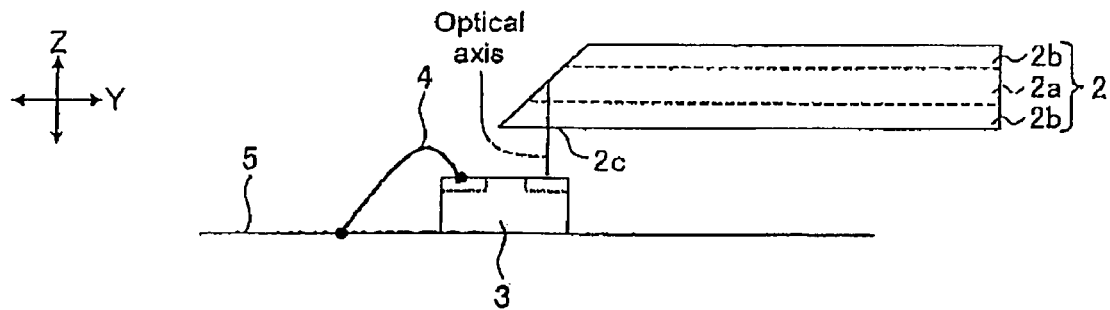

FIG. 1 (a) is a plan view showing a schematic configuration of an optical module 1 according to the present embodiment, FIG. 1 (b) is an enlarged view of an end of an optical waveguide 2, and FIG. 1 (c) is a side view showing a schematic configuration of the optical module 1.

The optical module 1 includes the optical waveguide 2, a light receiving/emitting element (optical element) 3, a bonding wire 4, and a package 5.

The optical waveguide 2 is configured by a core part 2a having a large index of refraction and a clad part 2b having a small index of refraction arranged contacting the periphery of the core part 2a, and is made to propagate an optical signal entered to the core part 2a while repeating total reflection at the boundary of the core part 2a and the clad part 2b. The optical waveguide 2 has flexibility since the core part 2a and the clad part 2b are made of polymer material having flexibility. The optical waveguide is preferably a film type in view of flexibility.

Both end faces of the optical waveguide 2 are machined to an inclined surface of 45 degrees, where the optical signal entering from an entrance/exit port 2c of the optical waveguide 2 is reflected at one inclined surface (light entrance surface), and guided into the optical waveguide 2. The optical signal reflected at the other inclined surface (light exit surface) exits from the entrance/exit port 2c. The angle of the end face of the optical waveguide 2 is not limited to 45 degrees, and the entered optical signal can be guided into the optical waveguide 2, for example, the end face may be machined to a right angle.

The light receiving/emitting element 3 converts an electrical signal to an optical signal, and an optical signal to an electrical signal. The light receiving/emitting element 3 is an area light receiving/emitting element which transmits and receives the optical signal from the surface on the opposite side of the mounting surface mounted inside the package 5.

The bonding wire 4 connects the light receiving/emitting element 3 and an electrical wiring (not shown), and transmits the electrical signal.

The package 5 is formed with a concave part having four sides surrounded by side walls rising from a bottom plate, where an opened surface (supporting part) 5a is arranged at the upper part. The optical waveguide 2; the light receiving/emitting element 3, and the bonding wire 4 are mounted in the concave part of the package 5.

A method of manufacturing the optical module 1 will be hereinafter described. In FIG. 1 and the following figures an axis parallel to a longitudinal direction of the optical waveguide 2 in the opened surface 5a of the package 5 is Y-axis, an axis orthogonal to the Y-axis is X-axis, a coordinate plane is X-Y plane, and an axis orthogonal to the X-Y plane is Z-axis.

First, the light receiving/emitting element 3, the bonding wire 4, the electrical wiring (not shown), and an electrical connecting part (not shown) are mounted in advance through methods such as soldering at the bottom plate of the package 5 fixed by a jig and the like. The light receiving/emitting element 3 is preferably mounted near the corner in the package 5. The optical waveguide 2 is gripped using an air chuck and the like, and position adjustment of the light receiving/emitting element 3 and the optical waveguide 2 is performed by an image recognition device (not shown) installed on an upper side (Z-axis direction) of the package 5. The optical waveguide 2 is fixed on the opened surface 5a of the package 5 through methods such as adhering at a position in which an image of the image recognition device is formed where a projection part (entrance/exit port) 2c of the core part at the inclined end face of the optical waveguide 2 and a receiving/transmitting part 3a of the light receiving/emitting element 3 coincide, as shown in FIG. 1 (b)

When defining the surface on the side facing the bottom plate mounted with the light receiving/emitting element 3 in the package 5 of the end of the optical waveguide 2 accommodated in the package 5, or the surface facing the light receiving/emitting element 3 herein, as a first region including a portion projecting into a space inside the package 5 of the end of the optical waveguide 2 accommodated in the package 5, that is, including the entrance/exit port 2c of the optical signal, and a second region different from the first region, the package 5 of the optical module I in the present embodiment is configured such that one part of at least one side of the surface forming the first region is supported by the side wall parallel to the Y-axis direction forming the package 5 in the first region, and one part of at least two sides of the surface forming the second region is supported by the side wall parallel to the X-axis direction forming the package 5.

In other words, the periphery of the entrance/exit port 2c of the optical waveguide 2 can be supported in at least two axes directions by the side walls parallel to the X-axis direction and the side wall parallel to the Y-axis direction forming the package 5.

One example of a mechanism of optical transmission in the optical module 1 manufactured according to the above method will be briefly described below.

The light emitting element 3 receiving the electric signal from a drive IC (not shown) transmits an optical signal corresponding to the relevant electric signal. The optical signal transmitted from the light emitting element 3 enters from one entrance/exit pod 2c of the optical waveguide 2, and is reflected towards the inside of the optical waveguide 2 at the inclined end face. The optical signal is propagated while being repeatedly reflected inside the optical waveguide 2, reflected at the inclined end face of the optical waveguide 2, exit from the other entrance/exit port 2c, and received by the light receiving element 3. The optical signal received by the light receiving element 3 is converted to an electric signal and amplified to the desired output by an amplifier and the like (not shown) of the next stage.

As described above, according to the optical module 1 of the present embodiment, deformation by heat and deformation by external force applied by mechanical factors such as vibration and dropping that occur near the entrance/exit port 2c of the optical signal in the optical waveguide 2 can be suppressed since the end of the optical waveguide 2 can be supported, Therefore, the fluctuation of optical coupling efficiency between the light receiving/emitting element 3 and the optical waveguide 2 can be suppressed by a simple configuration without a complex structure such as a structure of forming the light receiving/emitting element 3 and the optical waveguide 2 on both surfaces of the circuit substrate as in a flip-flop structure.

In the present embodiment, there is adopted a configuration of supporting the end of the optical waveguide 2 so as to be placed on the opened surface 5a of the package 5, but there may be adopted other configurations such as adhering and fixing the side surface of the optical waveguide 2 to the surface facing the space inside the package 6 at the side wall parallel to the Y-axis forming the package 5. Thus, the periphery of the entrance/exit port 2c of the optical signal in the optical waveguide 2 can be supported in two directions. Since only the end on one side of the optical waveguide 2 is supported, the degree of freedom of wiring (wire) for connecting the light receiving/emitting element 3 and the IC increases, whereby the degree of freedom of the mounting position of electronic components such as light receiving/emitting element and IC increases without causing degradation of signal noise, and a satisfactory space-saving circuit design can be realized.

Figure 2:
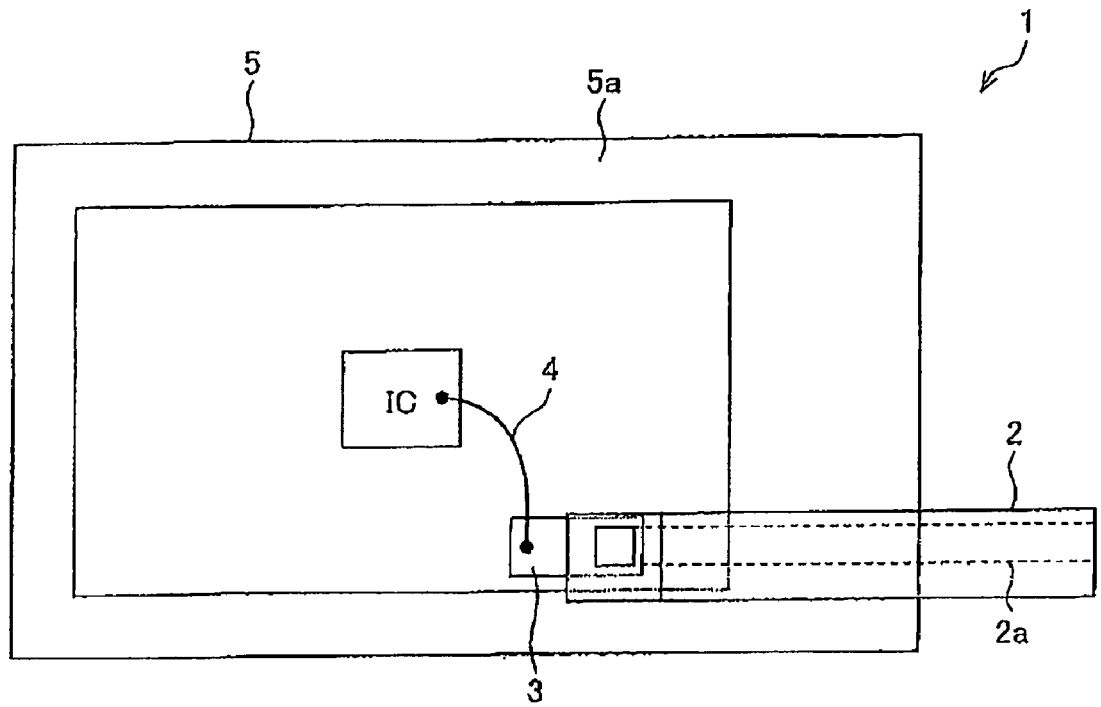
FIG. 2 is a plan view showing a schematic configuration of an optical module in a case where a center axis of a core part is shifted from a center axis of an optical waveguide.

As shown in FIG. 2, there may be adopted a configuration in which the center axis of the core part 2a is shifted from a center axis of the optical waveguide 2. The region of the end of the optical waveguide 2 that can be placed on the opened surface 5a of the package 5 thus enlarges, and the end of the optical waveguide 2 can be more reliably supported.

Figure 3:
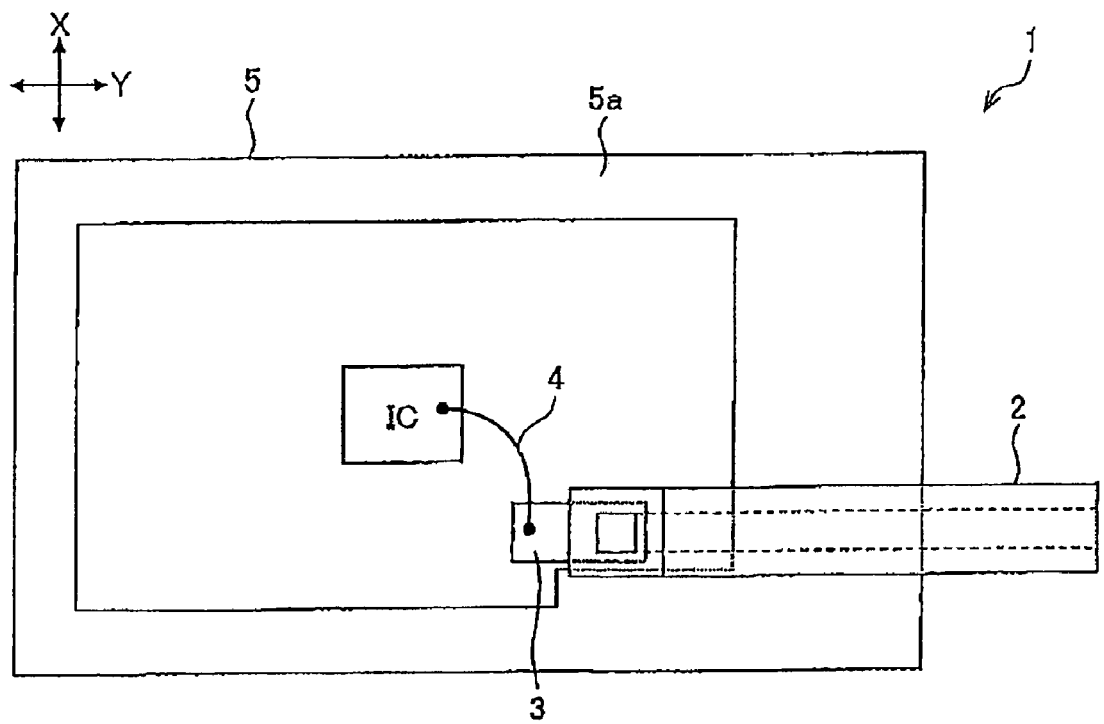
FIG. 3 is a plan view showing a schematic configuration of an optical module in a case where a side wall of one part of a package to be mounted with an optical waveguide is thicker than other portion in an X-axis direction.

As shown in FIG. 3, there may be adopted a configuration in which the side wall of one part of the package 5 on which the optical waveguide 2 is placed is made thicker than other portions in the X-axis direction.

Generally, the package 5 used in the optical module 1 often has a lid structure in view of protecting the optical waveguide 2. In this case, the side wall of the package 5 is sometimes ensured as a space for adhering with the lid member. In such case, only one part of the side wall is made thick so that the adhering area of the lid and the optical waveguide 2 can be enlarged.

Figure 4:
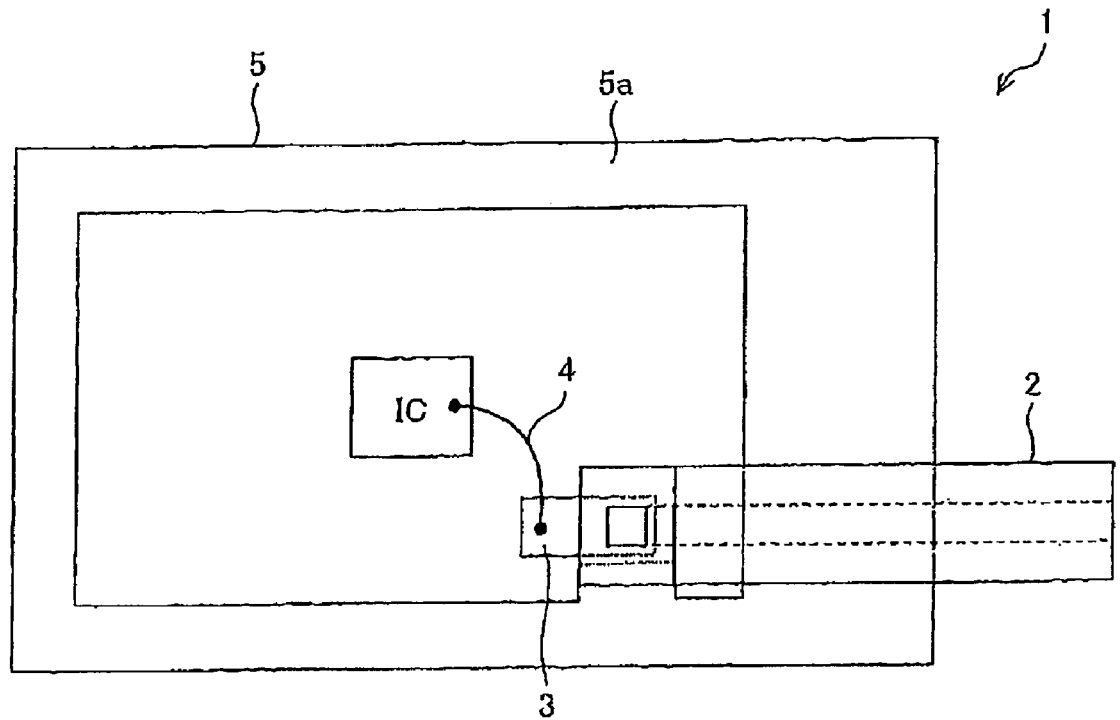
FIG. 4 is a plan view showing a schematic configuration of an optical module in a case where the side wall of the package is projected to the inside and the end on one side of an optical waveguide is supported by the projecting portion.
Figure 5:
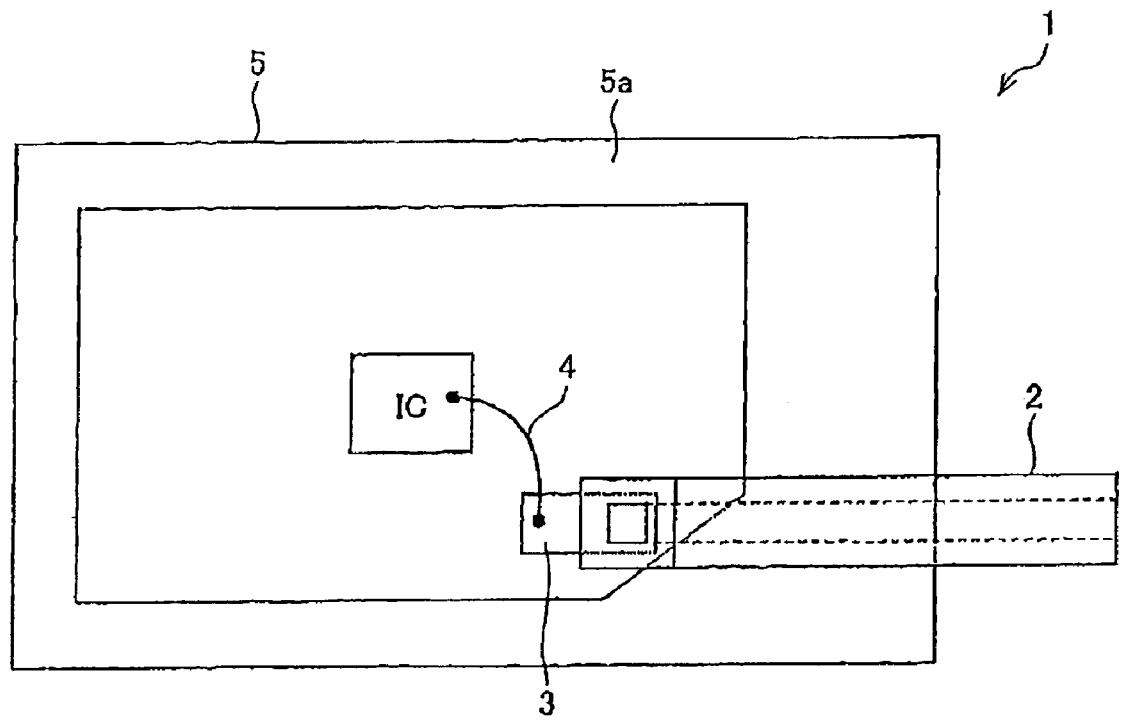
FIG. 5 is a plan view showing a schematic configuration of an optical module in a case where the side wall of the package is projected to the inside and the end on one side of the optical waveguide is supported by the projecting portion.

The shape of the side wall is not limited to the shape shown in FIG. 3, and various shapes can be applied. As shown in FIG. 4 and FIG. 5, there may be adopted a configuration in which the side wall of the package 5 is projected to the inside, and the end on one side of the optical waveguide 2 is supported at the projecting portion.

Recently, particularly in information terminals such as mobile terminal, cases requiring extreme miniaturization of the mounting device frequently occur, which imposes a burden on the device mounting area in the package 5. Thus, there is a need to ensure the mounting (circuit) area as much as possible. In this regards, according to the configuration shown in FIG. 4 and FIG. 5, the area of the side wall supporting the optical waveguide 2 can be suppressed, and thus the deformation of the end of the optical waveguide 2 can be prevented and the device mounting area in the package 5 can be enlarged.

Figure 6:
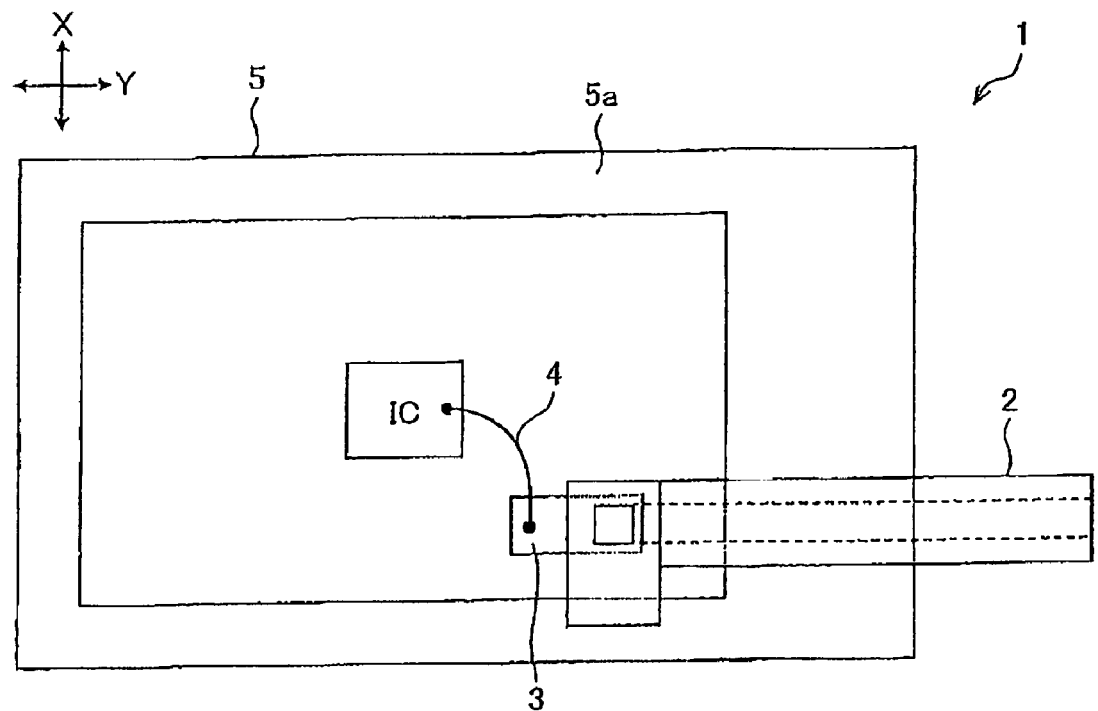
FIG. 6 is a plan view showing a schematic configuration of an optical module in a case where a distal end of the optical waveguide is formed extending in a direction (X-axis direction) orthogonal to an extending direction (Y-axis direction) of the optical waveguide so as to be placed on the opened surface of the side wall of the package.

As shown in FIG. 6, the optical waveguide 2 may be configured such that the distal end thereof is formed extending in a direction (X-axis direction) orthogonal to an extending direction (Y-axis direction) of the optical waveguide 2 so as to be placed on the opened surface 5a of the side wall of the package 5 The flexible optical waveguide 2 inevitably becomes an organic optical waveguide, and the degree of freedom greatly increases in the cutting process as opposed to the conventional inorganic waveguide, and thus the rectangular optical waveguide does not necessarily need to be premised on, and the cutting method shown in FIG. 6 can be easily realized by the existing film cutting technique. According to such configuration, greater mounting area of the device in the package 5 can be ensured.

Figure 7:
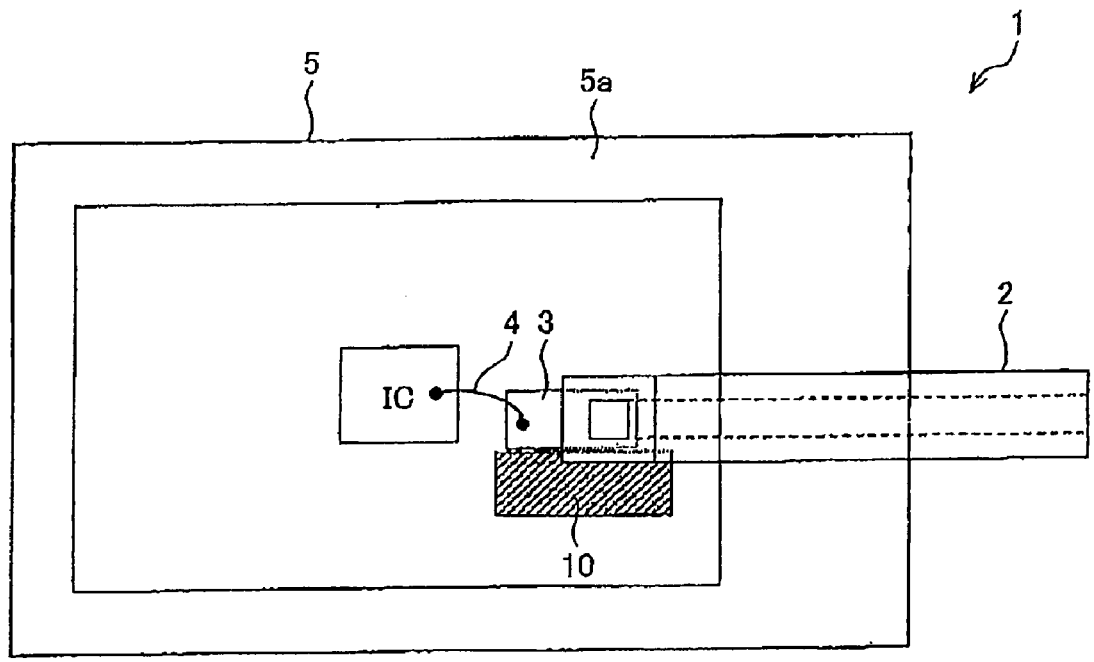
FIG. 7 is a plan view showing a schematic configuration of an optical module in a case of supporting the end of the optical waveguide on an electronic device.

As another configuration for supporting the end of the optical waveguide 2, an electronic device 10, specifically, a chip resistor or a chip capacitor mounted near the light receiving/emitting element 3 may be used, as shown in FIG. 7. Specifically, the end of the optical waveguide 2 is supported on the electronic device 10.

Based on the fact that the optical waveguide 2 is very flexible and that the light receiving/emitting element 3 is wire bonded, the electronic device 10 used as a supporting part needs to be higher than the height of the light receiving/emitting element 3 and the wire part combined. The mounting height of the chip component has very stable due to the recent mounting technique and is applicable as a supporting part, and thus the end of the optical waveguide 2 can be supported without reducing the circuit area.

When mounting the optical module on an equipment having a movable structure where large twistability is required for the wiring to realize a bi-directional communication, the twistability is significantly inhibited since the width of one optical waveguide 2 becomes large in the conventional configuration of forming a plurality of core parts 2a in one optical waveguide 2.

Figure 8:
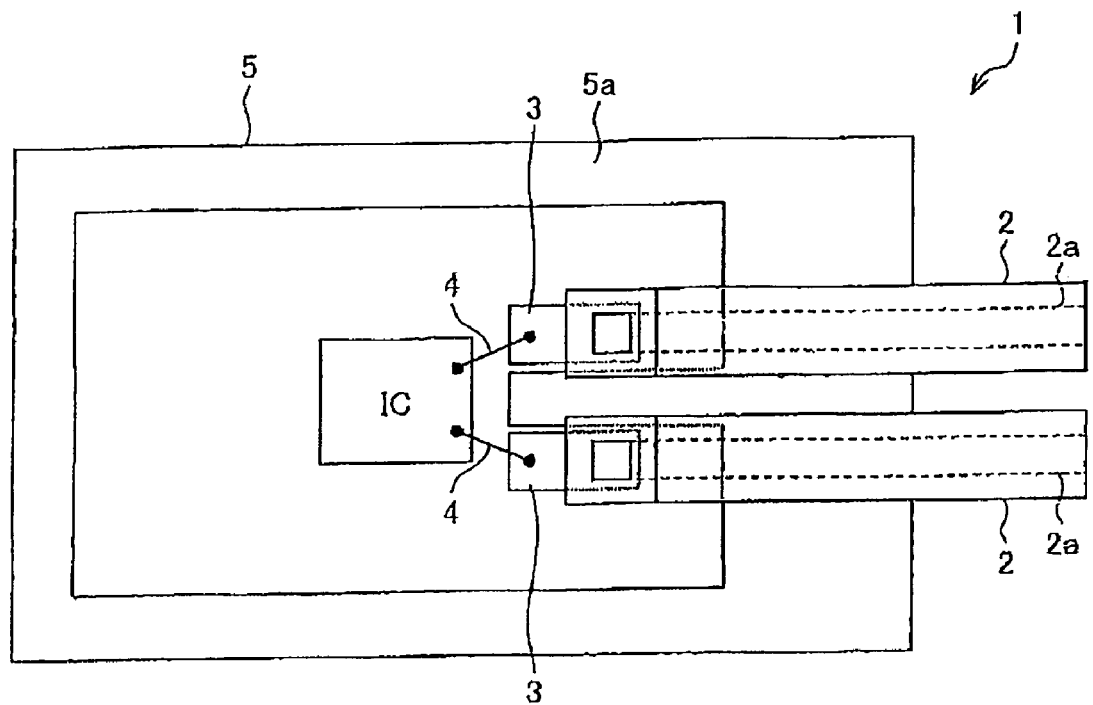
FIG. 8 is a plan view showing a schematic configuration of an optical module in a case where the optical waveguide is arranged in plurals.
Figure 9:
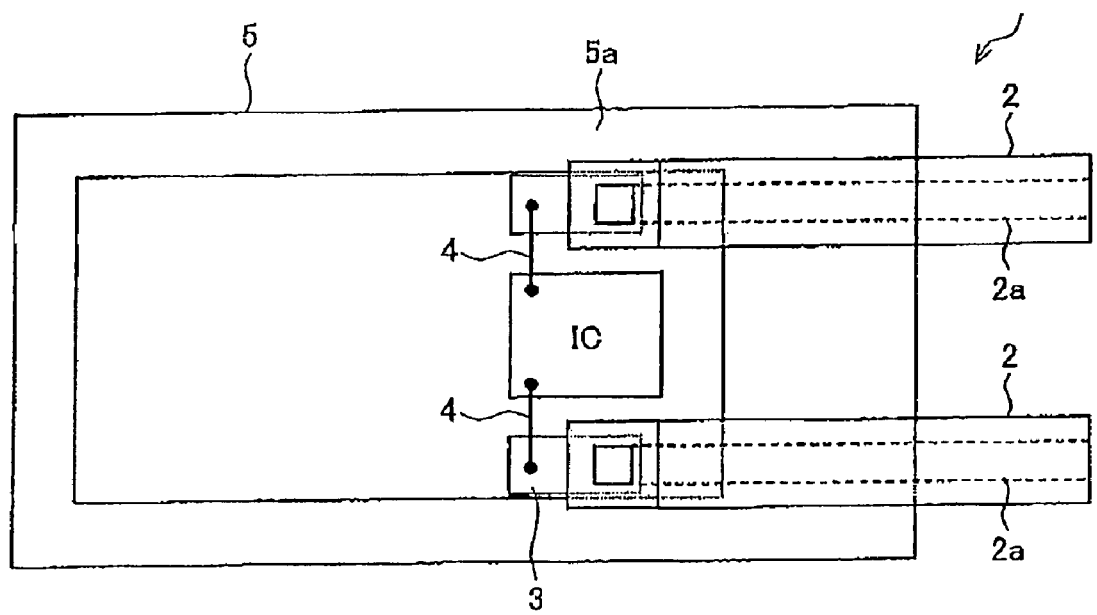
FIG. 9 is a plan view showing a schematic configuration of an optical module in a case where the optical waveguide is arranged in plurals.

A configuration of mounting a plurality of optical waveguides 2 while narrowing the width of one optical waveguide 2 as much as possible is preferable as shown in FIG. 8 and FIG. 9. According to such configuration, the above described problem related to the adhering area merely needs to take into consideration the state integrating the number of core parts 2a. According to the above-described configuration, in particular, the above problem is greatly reduced by adopting a configuration of supporting only the end on one side of the optical waveguide 2 compared to the case of supporting both ends of the optical waveguide 2. Furthermore, since the spacing between the core parts 2a can be narrowed, and since the degree of freedom increases in a pull-out direction of the wiring, the distance with a transmission/reception IC having a driving and amplifying function becomes short with respect to two transmission/reception elements, and signal degradation caused by the length of the connection wiring (wire) can be suppressed. Alternatively, there is no need to unnecessarily enlarge the IC and form the IC pad near each light receiving/emitting element.

Furthermore, according to the configuration shown in FIG. 8, the supporting part acts as a light shielding wall and reduces optical cross-talk. According to the configuration shown in FIG. 9, the optical waveguide 2 is consciously supported by both side walls of the package 5, thereby giving a degree of freedom to the arrangement of the IC and making the length of the wire connecting the IC and the light receiving/emitting element 3 the shortest.

Figure 10:
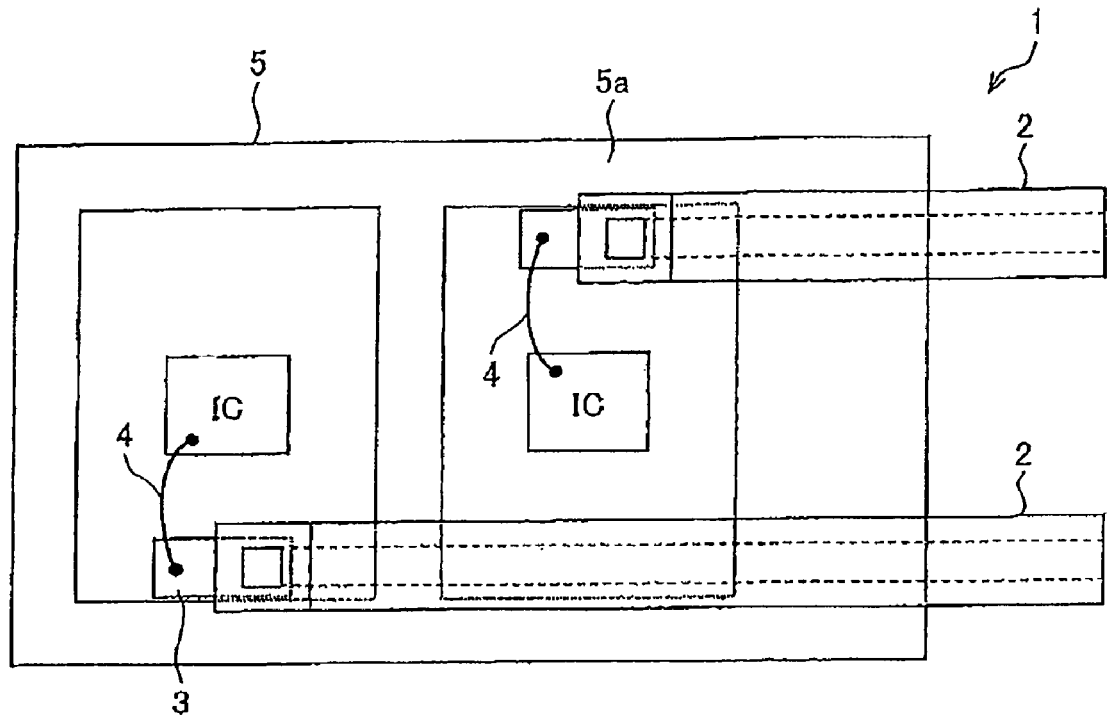
FIG. 10 is a plan view showing a schematic configuration of another optical module in a case where the optical waveguide is arranged in plurals.

A configuration example realizing the effects obtained by the configurations shown in FIG. 8 and FIG. 9 is shown in FIG. 10. According to the configuration shown in FIG. 10, the end of the optical waveguide 2 can be supported and the side wall can be arranged between the light emitting element 3 and the light receiving element 3, whereby the optical cross-talk in the bi-directional communication can be reduced. When forming the IC with one chip, the signal degradation caused from the length of the wire occurs between the light receiving element and the amplification circuit of the initial stage, which is a wiring part having the weakest signal, and thus the transmission/reception IC may be arranged on the reception side.

Figure 11:
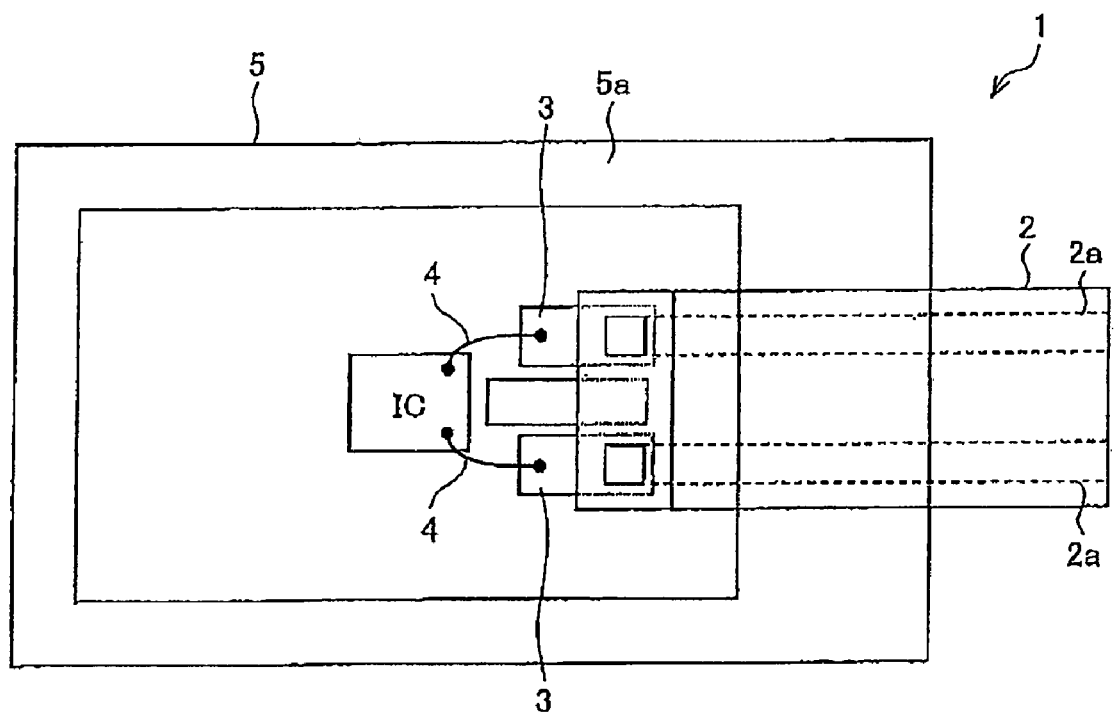
FIG. 11 is a plan view showing a schematic configuration of an optical module in a case where a supporting part for supporting the optical waveguide is not integrated with the side wall forming the package.

As shown in FIG. 11, the supporting part for supporting the optical waveguide 2 may not be integrated with the side wall forming the package. If an extreme twistability is not required, a plurality of core parts 2a may be formed in the optical waveguide 2. In the case of this figure, the side wall for realizing miniaturization of the adhering area of the optical waveguide 2 and reduction of the optical cross-talk Is configured so that two core parts 2a formed in one optical waveguide is supported. Thus, even if one optical waveguide 2 is provided and the plurality of core parts 2 are formed therein, the twistability can be ensured without widening the width of the optical waveguide 2.

Figure 12:
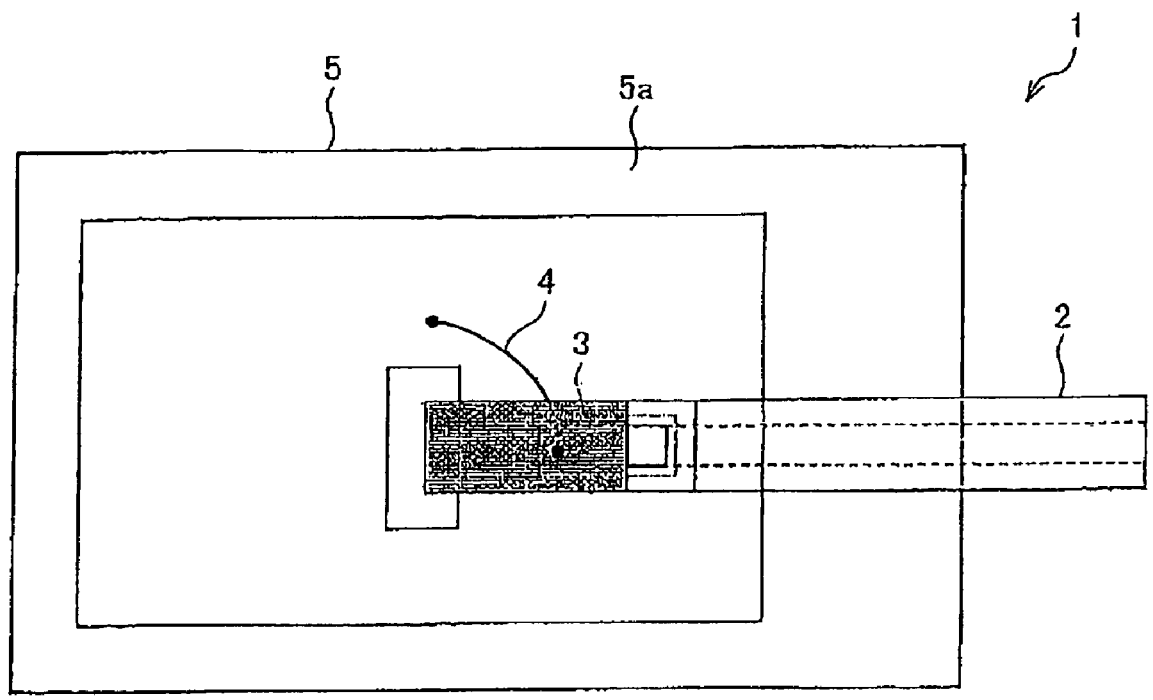
FIG. 12 is a plan view showing a schematic configuration of an optical module in a case where a clad part of the optical waveguide acts as the supporting part.
Figure 12:
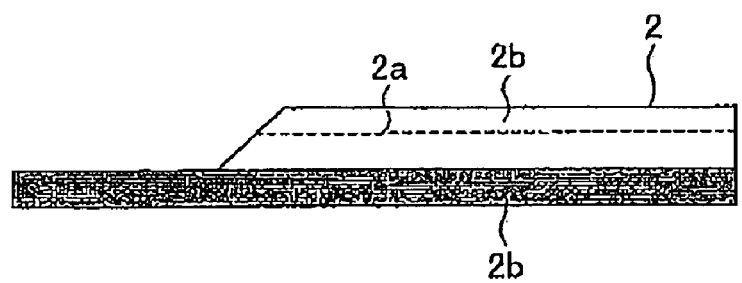
Figure 13:
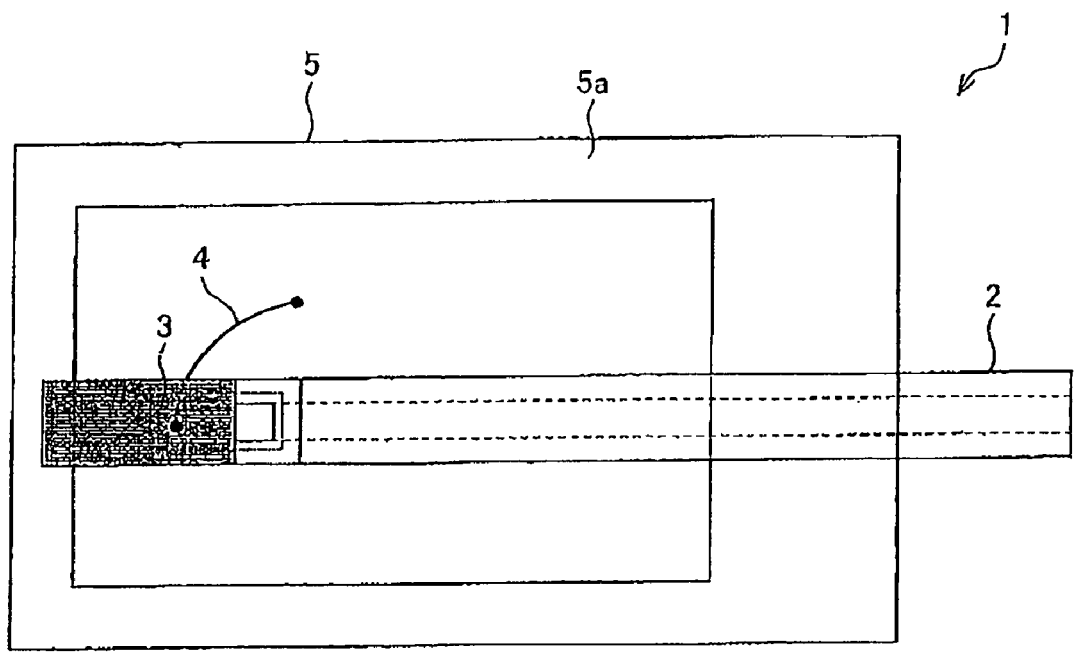
FIG. 13 is a plan view showing a schematic configuration of another optical module in a case where a clad part of the optical waveguide acts as the supporting part.
Figure 13:
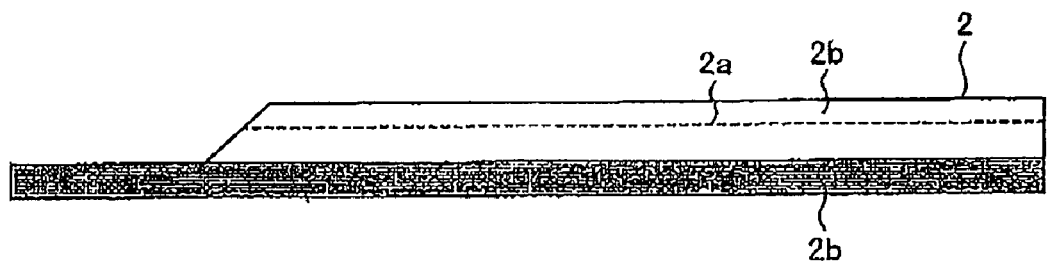

As shown in FIG. 12 and FIG. 13, the optical waveguide 2 may form the supporting part using a portion of one part at the distal end of the optical waveguide 2 but not the optical path, that is, the clad part 2b. The distal end may have the film cut or removed leaving the lower clad part 2b, or similar thin-film may be attached after forming the film-type optical waveguide 2. FIG. 12 is a view showing a state in which the supporting part is placed on the electronic device mounted in the package 5, and FIG. 13 is a view showing a state in which the optical waveguide 2 is placed on a side wall (opened part 5a) on the side facing the traversing side wall. That is, an example where the supporting part is formed in the opposing side wall of the package 5. There may be adopted a structure in which a different base material such as a film is attached to the lower portion of the clad part 2b instead of the clad part 2b.

Thus, by using one part of the package 5 inevitably formed in an aim of sealing the optical module 1 and the like, an extra area does not need to be assigned to support the end of the optical waveguide 2, in which case the degree of freedom significantly can be enhanced such as the drawing of the wire in three directions becomes possible in FIG. 12 and FIG. 13.

Figure 14:
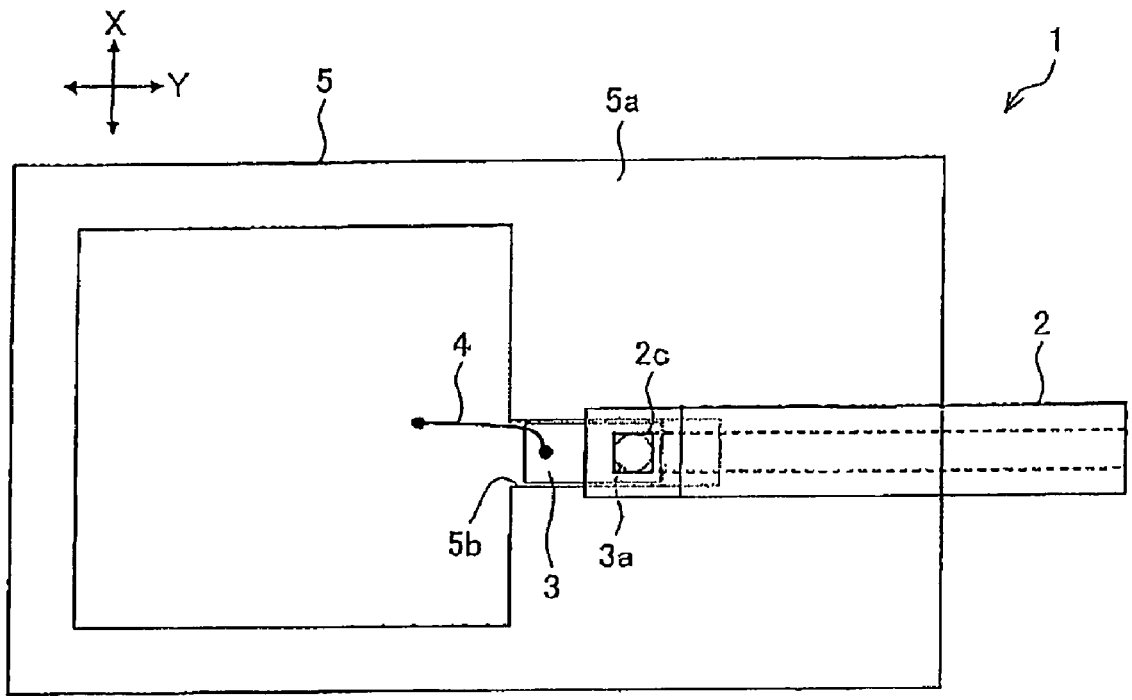
FIG. 14 is a plan view showing a schematic configuration of an optical module in a case where a groove part is formed in the package shown in FIG. 1 (a).

As shown in FIG. 14, there may be adopted a configuration in which a groove part 5b parallel to the Z-axis direction is formed on the surface on a space side inside the package 5 of the side wall supporting the optical waveguide 2 in the package 5. The width in the X-axis direction of the groove part 5b is smaller than the width in the X-axis direction of the optical waveguide 2, and larger than the width in the X-axis direction of the light receiving/emitting element 3. The width in the Y-axis direction of the groove part 5b, that is, the depth of the groove part 5b preferably has a size of an extent that the receiving/transmitting part 3a of the optical signal in the light receiving/emitting element 3 can be accommodated.

Thus, the end of the optical waveguide 2 can be supported so as to surround three directions of the periphery of the entrance/exit port 2c of the optical waveguide 2 That is, the end of the optical waveguide 2 can be supported in three axes directions of the X-axis direction and Y-axis direction at two locations, Therefore, the end of the optical waveguide 2 can be more reliably supported.

Figure 15:
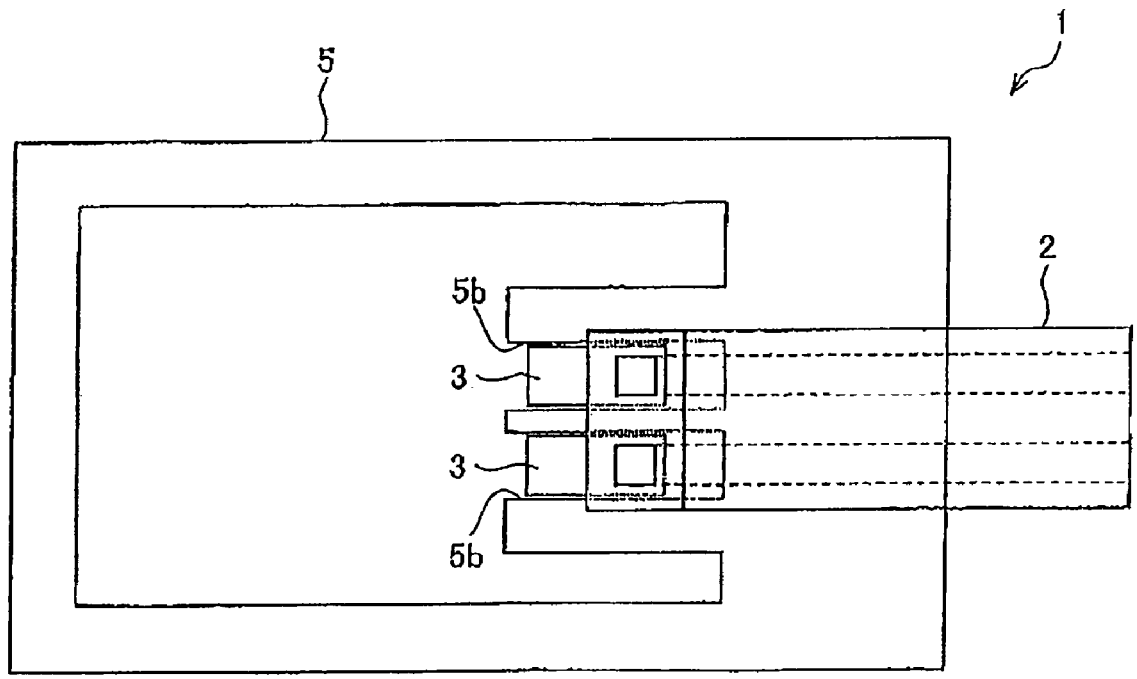
FIG. 15 is a plan view showing a schematic configuration of an optical module in a case where a plurality of groove parts is formed in the package shown in FIG. 1 (a).

As shown in FIG. 15, there may be adopted a configuration in which the groove part 5b is arranged in plurals at one side wall of the package 5. According to such configuration, when using a plurality of optical waveguides 2 or when using an optical cable in which a plurality of optical waveguides is formed in a single optical transmission medium (not shown), the end of each optical waveguide 2 and an end of the optical transmission medium can be supported by arranging the groove part 5b in correspondence to each optical waveguide 2. Thus, the optical module 1 of high transmission efficiency suppressed with the fluctuation of the optical coupling efficiency can be realized.

Figure 16:
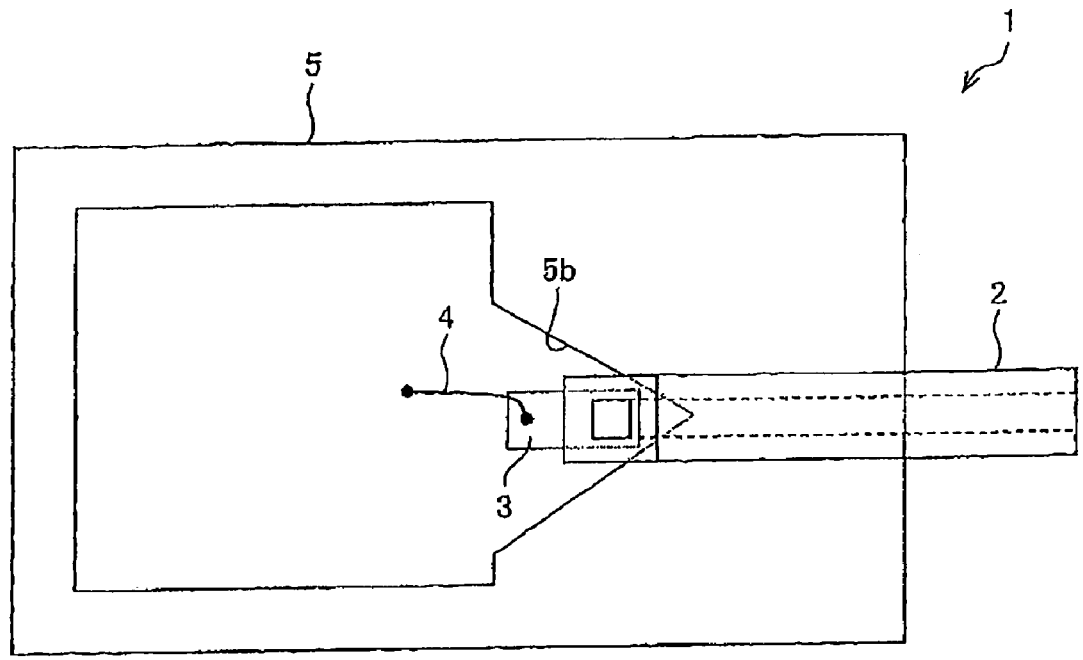
FIG. 16 is a plan view showing a schematic configuration of an optical module in a case where a V-shaped groove part is formed in the package shown in FIG. 1 (a).

As shown in FIG. 16, the groove part 5b may be formed to a V-shape. According to such configuration, the two directions at the periphery of the entrance/exit port 2c of the optical waveguide 2 can be supported.

Figure 17:
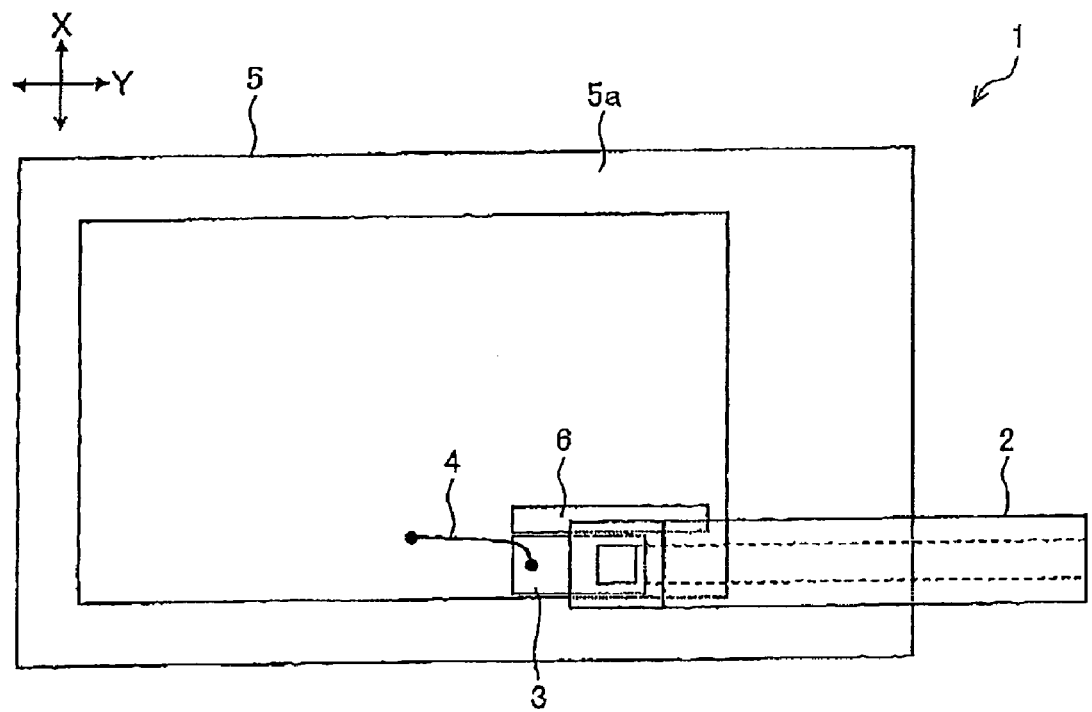
FIG. 17 is a plan view showing a schematic configuration of an optical module in a case where a supporting column is arranged in a concave part of the package shown in FIG. 1 (a).

A supporting column (supporting pad) 6 may be arranged in the concave part of the package 5 to support the end of the optical waveguide 2. FIG. 17 is a plan view showing such configuration.

The supporting column 6 has a square columnar shape long in the Y-axis direction, where the height In the Z-axis direction is equal to the height of the side wall of the package 5. The supporting column 6 is arranged in the concave part so as to face the side wall parallel in the Y-axis direction in the package 5, and the light receiving/emitting element 3 is mounted between the supporting column 6 and the relevant side wall.

According to such configuration, the end of the optical waveguide 2 can be supported by the side wall of the package 5 and the supporting column 6.

Figure 18:
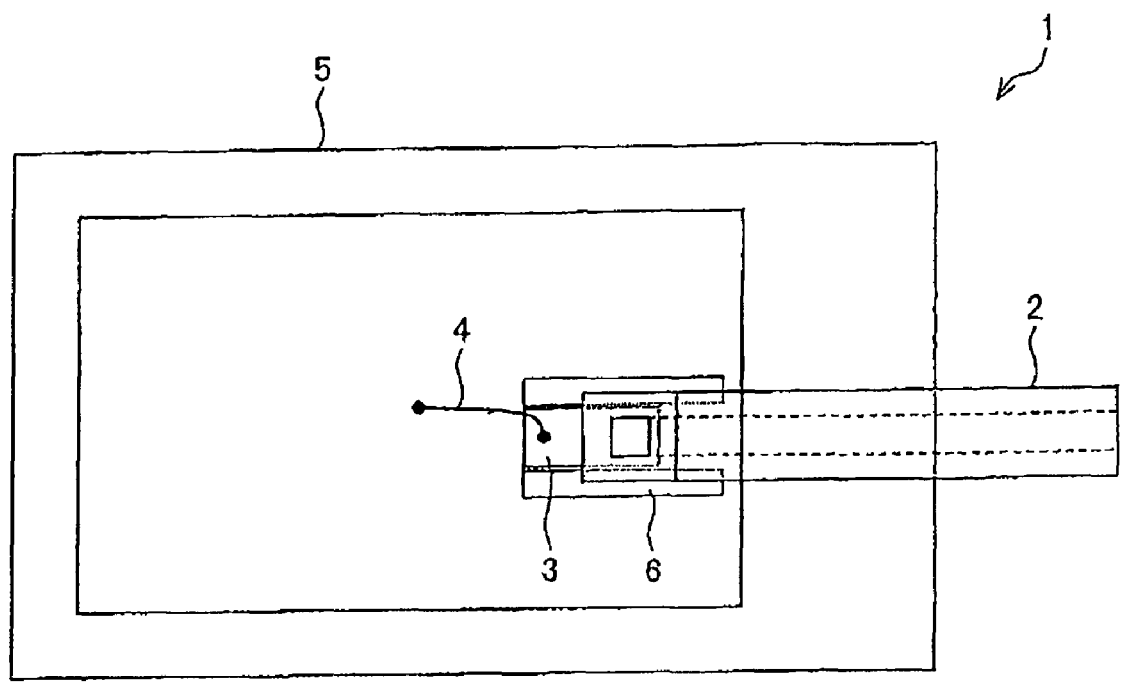
FIG. 18 is a plan view showing a schematic configuration of an optical module in a case where a supporting column is further arranged in the package shown in FIG. 17.

FIG. 18 is a side view showing a schematic configuration of the optical module 1 in a case where the supporting column 6 is further arranged in the configuration of FIG. 17. According to the configuration of this figure, the end of the optical waveguide 2 is supported by two supporting columns 6 in the X-axis direction. The end of the each optical waveguide 2 or the end of the optical transmission medium can be similarly supported by arranging the supporting column 6 in correspondence to the respective optical waveguide 2 when using a plurality of optical waveguides 2 or when using the optical cable in which a plurality of optical waveguides is formed in a single optical transmission medium.

Figure 19A:
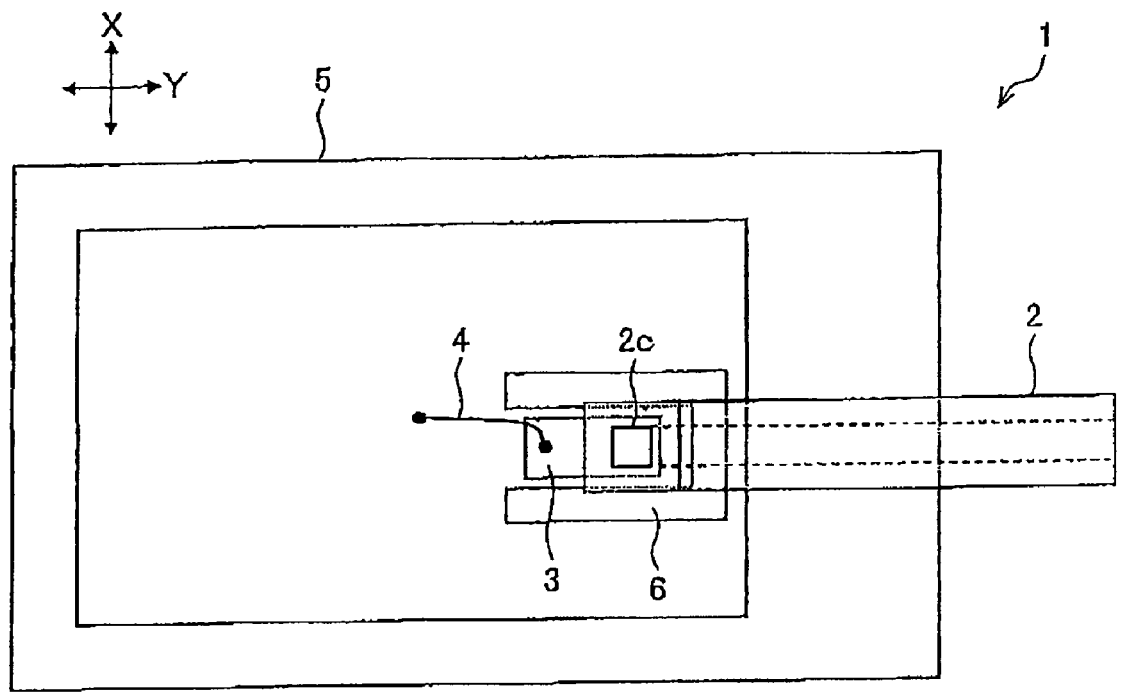
FIG. 19(a) is a plan view showing a schematic configuration of an optical module in a case where a horseshoe shaped supporting column is arranged in the package shown in FIG. 1 (a).
Figure 19B:
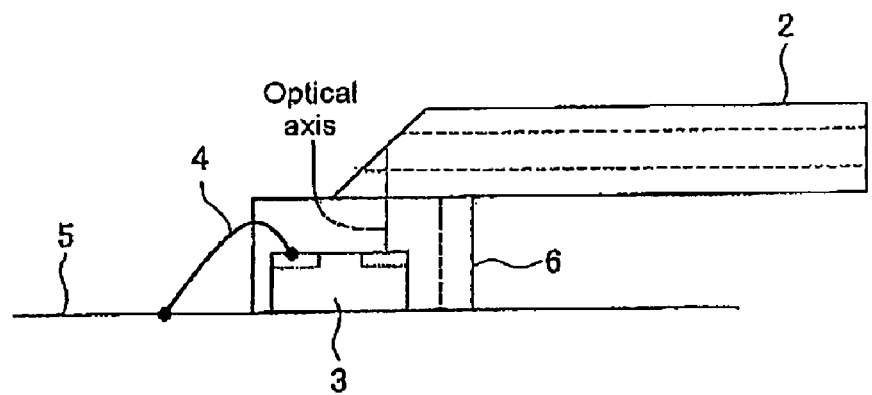
FIG. 19(b) is a side view of the optical module shown in FIG. 19(a).

As shown in FIGS. 19(*a*) and 19(*b*), the supporting column 6 may be formed to a horseshoe shape. Thus, the end of the optical waveguide 2 can be supported so as to surround three sides at the periphery of the entrance/exit port 2c of the optical waveguide 2. That is, the end of the optical waveguide 2 can be supported in three axes directions of the X-axis direction and the Y-axis direction at two locations. The deformation of the end of the optical waveguide 2 is thus more reliably suppressed.

The height in the Z-axis direction of the supporting column 6 supporting the end of the optical waveguide 2 may be the same height as the light receiving/emitting element 3. In this case, the end of the optical waveguide 2 can be supported with the optical waveguide 2 and the light receiving/emitting element 3 being closely attached. The connection loss of the optical waveguide 2 and the light receiving/emitting element 3 thus can be alleviated. A large allowable error in the position relationship of the optical waveguide 2 and the light receiving/emitting element 3 thus can be provided.

Figure 20:
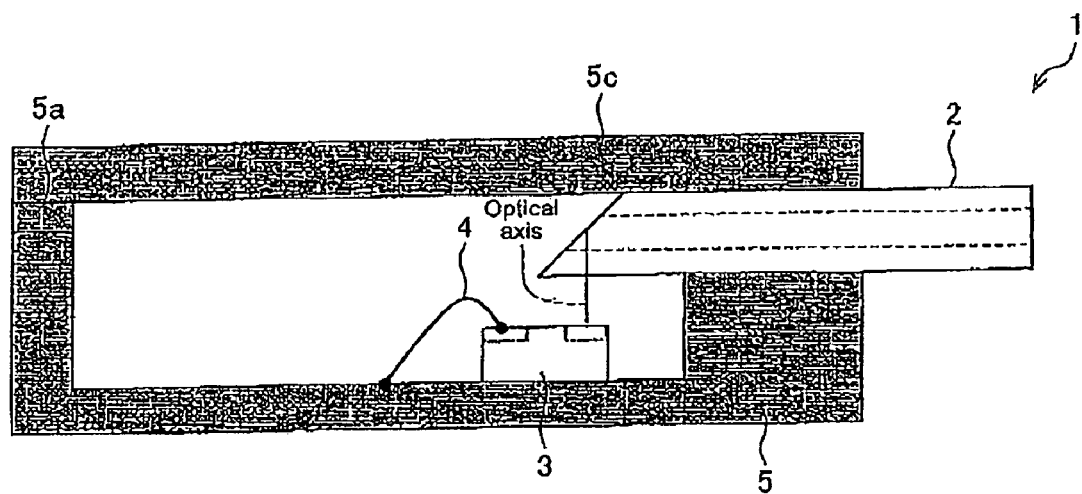
FIG. 20 is a side view showing a schematic configuration of an optical module in a case where a lid is arranged in the package shown in FIG. 1(a).

The package 5 may have a configuration including a lid (supporting part) 5c for blocking the concave part of the package 5. FIG. 20 is a side view showing a schematic configuration of the optical module 1 in which the package 5 includes the lid 5c.

The lid 5c is fixed through methods such as adhering to the opened surface 5a of the package 5, and is made to close the interior of the package 5. The method of manufacturing the optical module including the lid 5c will be hereinafter described using FIG. 21.

First, the optical waveguide 2 is fixed to the surface to be adhered to the package 5 of the lid 5c in advance through methods such as adhering. The lid 5c and the optical waveguide 2 are gripped using an air chuck and the like in an integrated state, and then adhered and fixed to the opened surface 5a of the package 5. An adhering position is preferably marked in advance when adhering the optical waveguide 2 to the lid 5c so that the optical waveguide 2 and the light receiving/emitting element 3 are reliably optically coupled.

The end of the optical waveguide 2 is thus supported in two directions of different surfaces in the Z-axis direction, that is, the opened surface 5a and the lid 5c of the package 5.

Figure 22A:
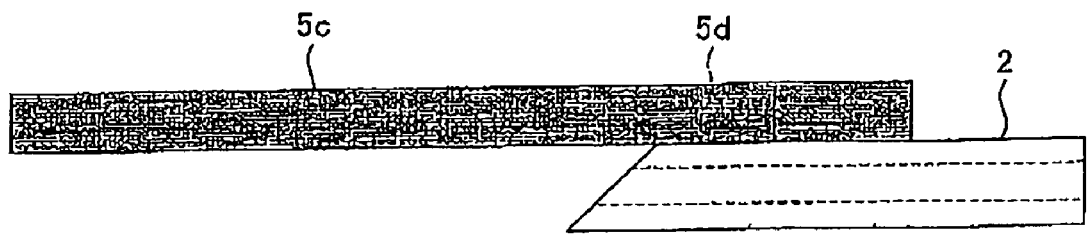
FIG. 22(a) is a side view in a case where a pass-through hole is formed in the lid shown in FIG. 20.
Figure 22B:
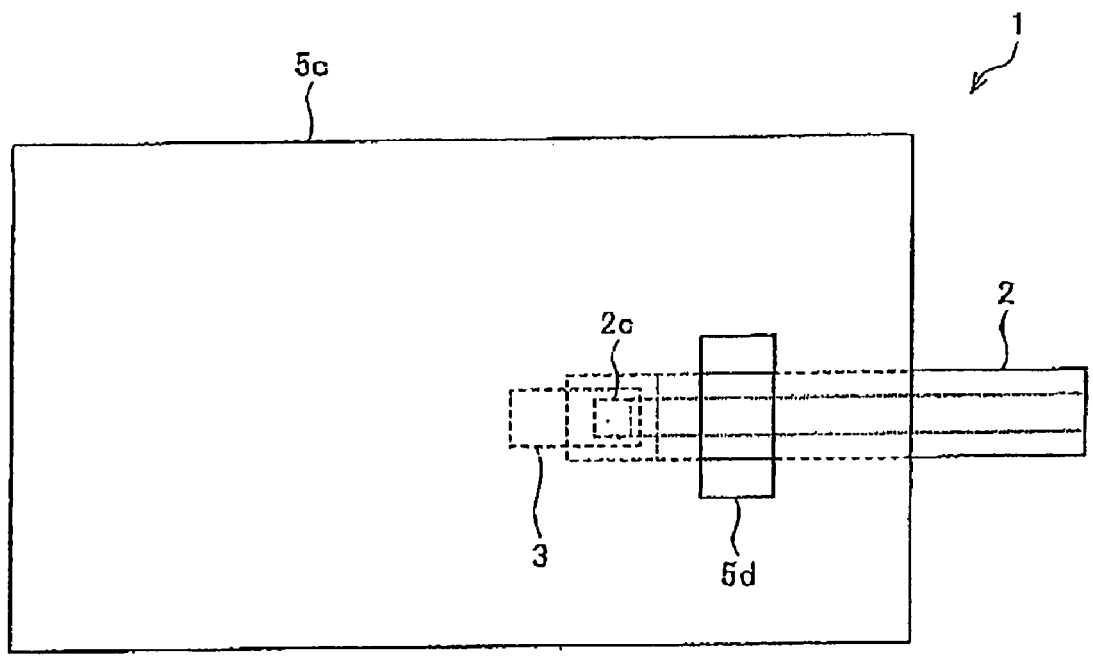
FIG. 22(b) is a plan view of the optical module equipped with the lid shown in FIG. 20 8.

As shown in FIG. 22(*a*) and FIG. 22(*b*), there may be adopted a configuration in which a pass-through hole 5d for injecting adhesive is formed in the lid 5c. The adhesive can be injected to the pass-through hole 5d after aligning the optical waveguide 2 to the lid 5c and then adhered, and thus the adhering process of the optical waveguide 2 and the lid 5c can be facilitated.

Since the optical waveguide 2 and the lid 5c can be adhered by injecting adhesive from the pass-through hole 5d; the lid 5c may be adhered to the package 5 after the adhering process of the optical waveguide 2 to the opened surface 5a of the package 5. Thus, the alignment of the optical waveguide 2 and the light receiving/emitting element 3 can be easily performed in advance.

Figure 23A:
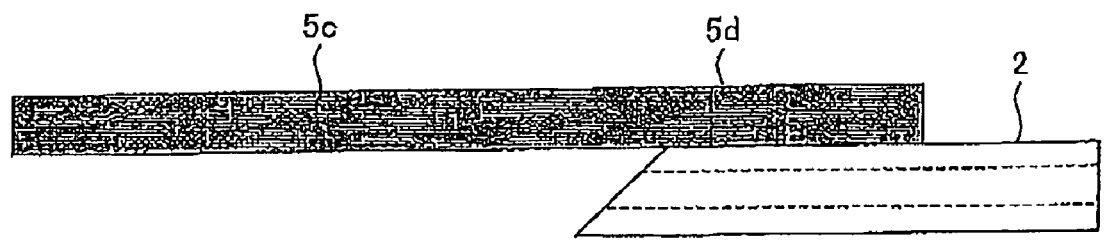
FIG. 23(a) is a side view showing another mode of the pass-through hole in the lid shown in FIG. 22(a) and FIG. 22(b).
Figure 23B:
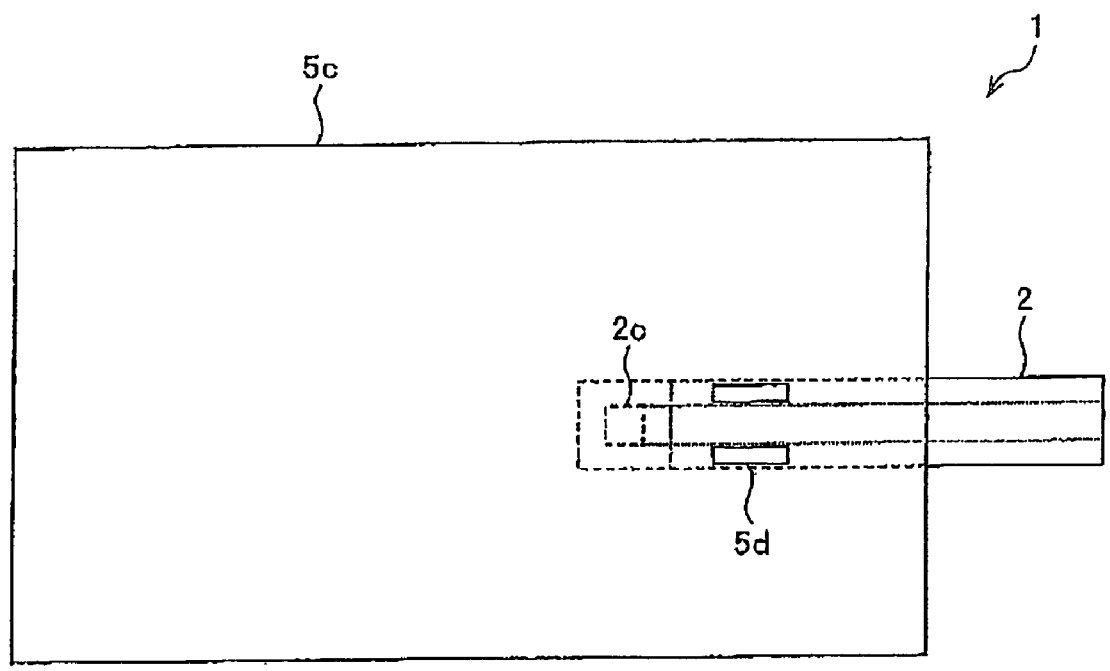
FIG. 23(b) is a plan view of the optical module equipped with the lid shown in FIG. 22(a) and FIG. 22(b).

The shape of the pass-through hole 5d is not particularly limited, and a small pass-through hole 5d may be formed in plurals, as shown in FIG. 23(*a*) and FIG. 23(*b*).

Figure 24A:
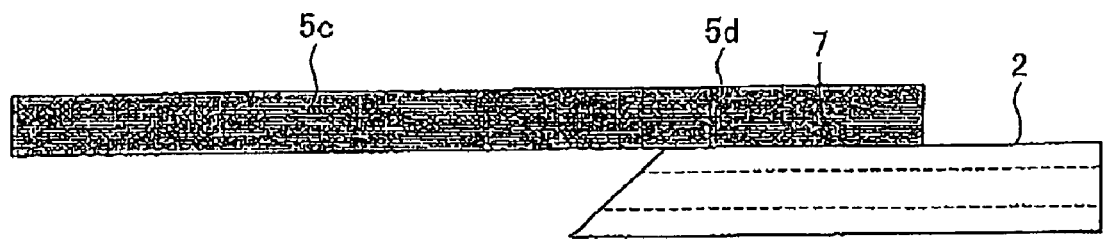
FIG. 24(a) is a side view showing another further mode of the pass-through hole in the lid shown in FIG. 22(a) and FIG. 22(b).
Figure 24B:
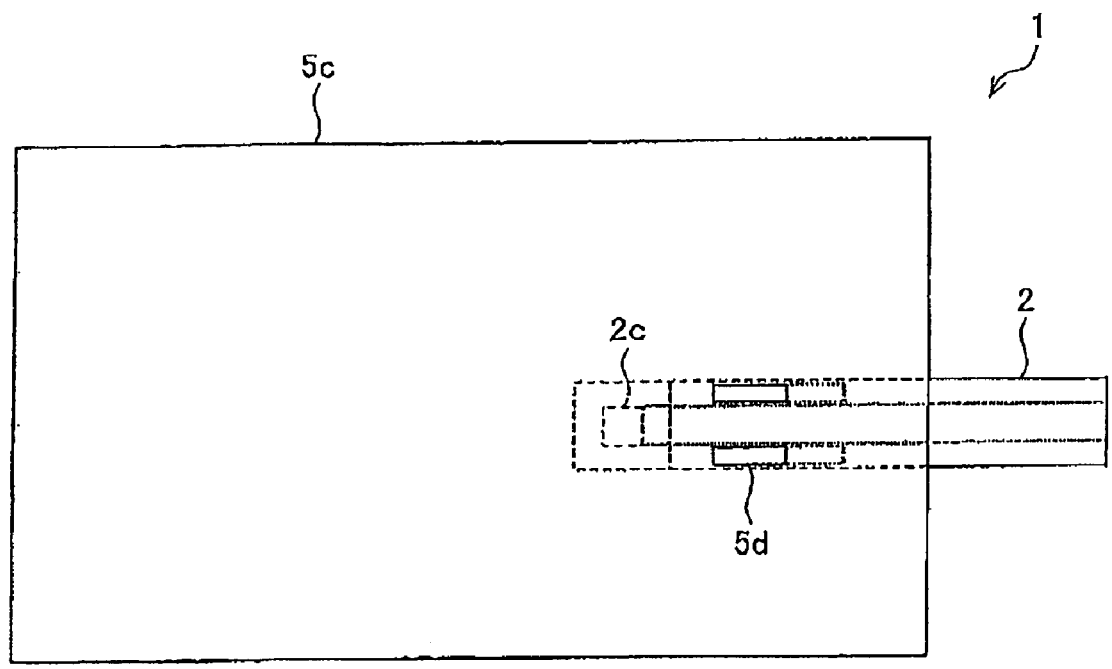
FIG. 24(b) is a plan view of the optical module equipped with the lid shown in FIG. 22(a) and FIG. 22(b).
Figure 25A:
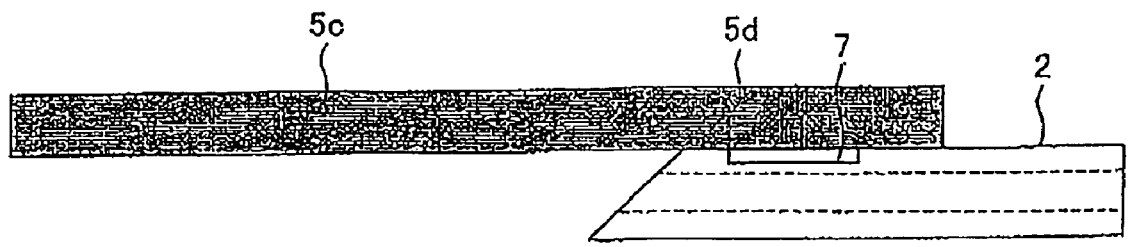
FIG. 25(a) is a side view in a case where the pass-through hole is formed in the lid shown in FIG. 22(a) and FIG. 22(b), and an adhesive spreading groove is formed in the optical waveguide.
Figure 25B:
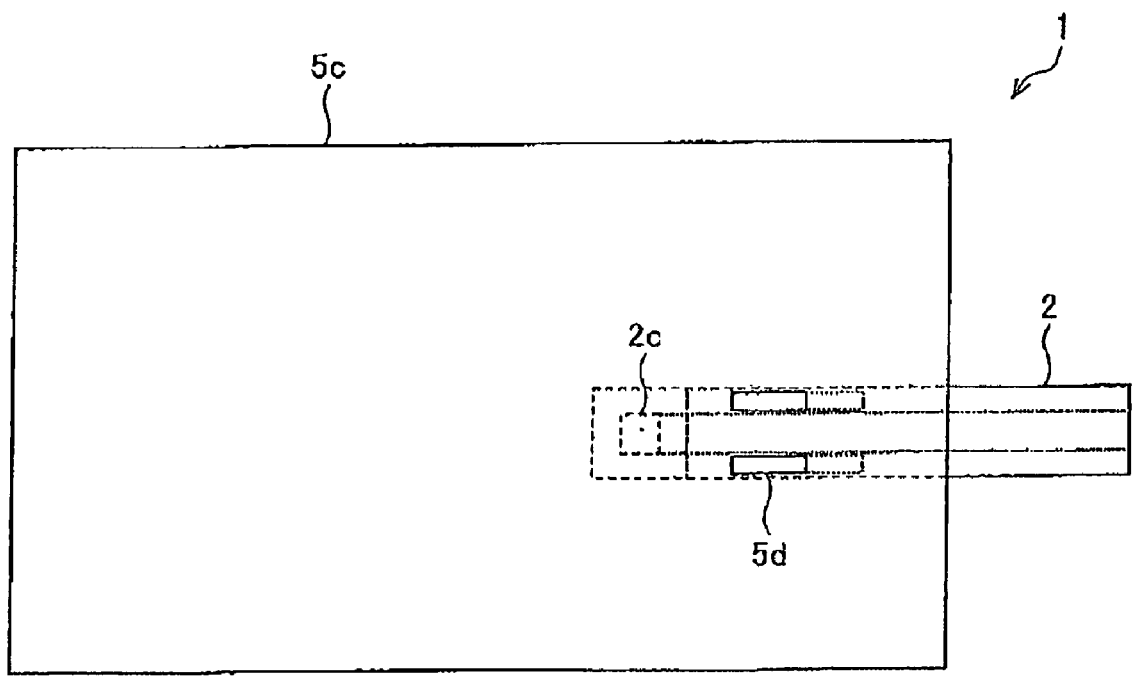
FIG. 25(b) is a plan view of an optical module equipped with the lid shown in FIG. 22(a) and FIG. 22(b) and the optical waveguide.
Figure 26A:
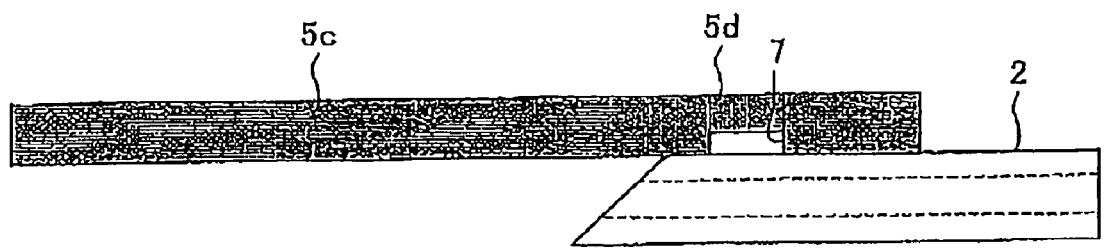
FIG. 26(a) is a side view in a case where the pass-through hole and the adhesive spreading grove are formed in the lid shown in FIG. 22(a) and FIG. 22(b).
Figure 26B:
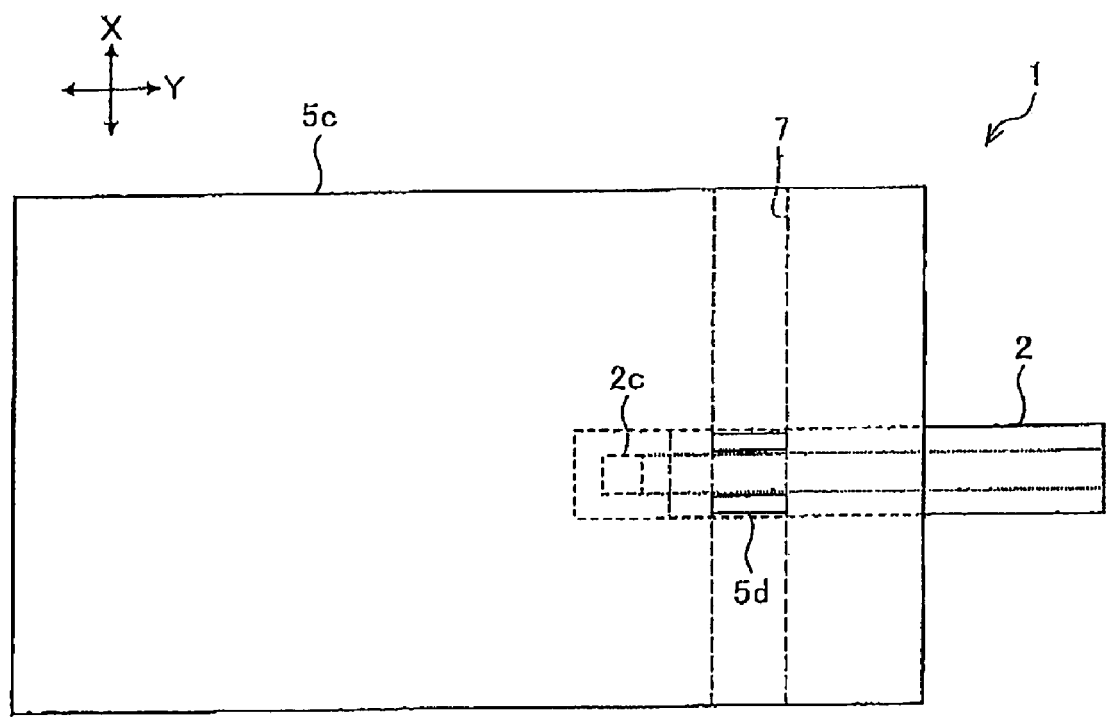
FIG. 26(b) is a plan view of an optical module equipped with the lid shown in FIG. 22(a) and FIG. 22(b).

As shown in FIG. 24(*a*) and FIG. 24(*b*) as well as FIG. 25(*a*) and FIG. 25(*b*) an adhesive spreading groove 7 may be formed in the lid 5c or the optical waveguide 2. As shown in FIG. 26(*a*) and FIG. 26(*b*), the pass-through hole 5d may be formed in the lid 5c, and the adhesive spreading groove 7 long in the X-axis direction may be formed in the surface to be adhered with the optical waveguide of the lid 5c. According to such configurations the adhering force of the optical waveguide 2 and the lid 5c increases, and thus the deformation of the end of the optical waveguide 2 is more reliably suppressed.

In addition to the configurations shown in FIG. 20 to FIG. 26(*a*) and FIG. 26(*b*), a configuration of supporting the optical waveguide 2 with a sealant 8 may be adopted.

Figure 27:
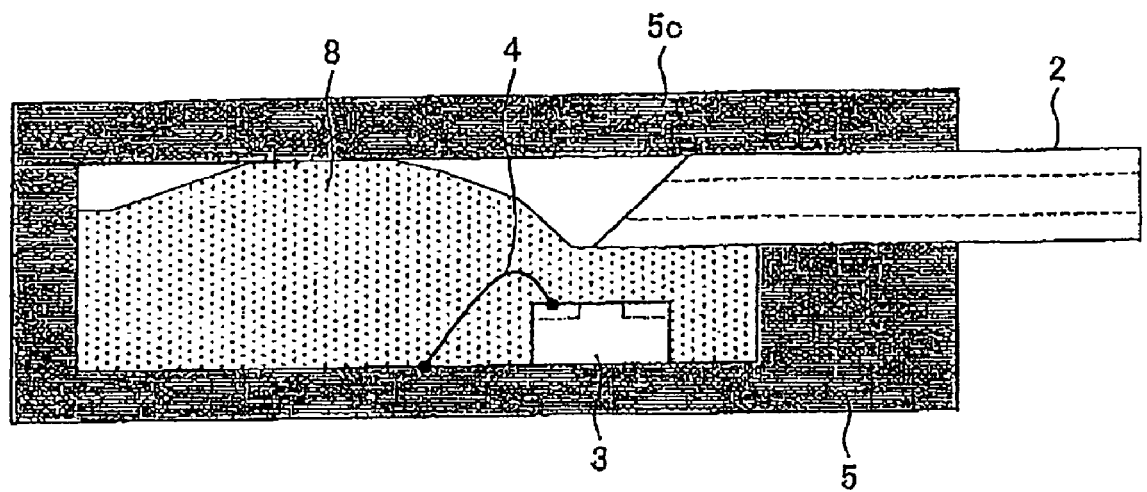
FIG. 27 is a side view of an optical module in a case where interior of the package shown in FIG. 20 is filled with sealant.
Figure 28A:
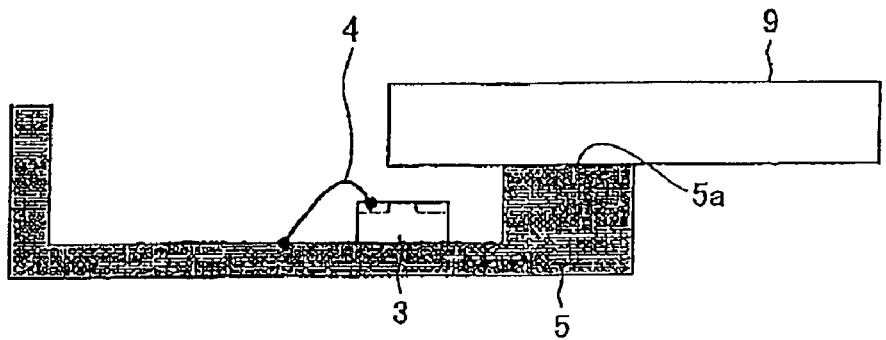
FIG. 28(a) is a side view showing a manufacturing process of the optical module shown in FIG. 27.
Figure 28B:
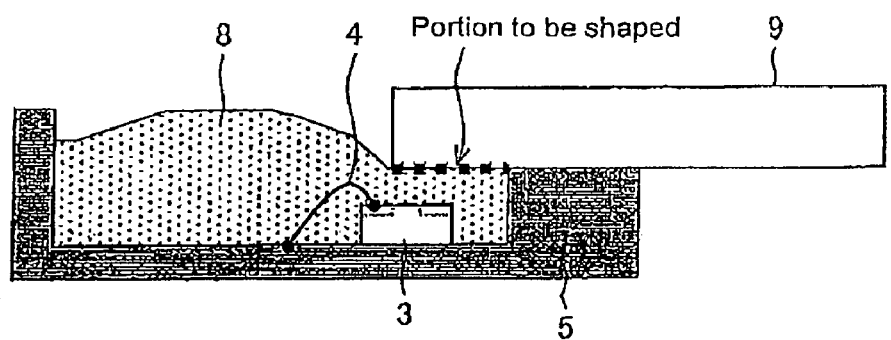
FIG. 28(b) is a side view showing the manufacturing process of the optical module shown in FIG. 27.
Figure 28C:
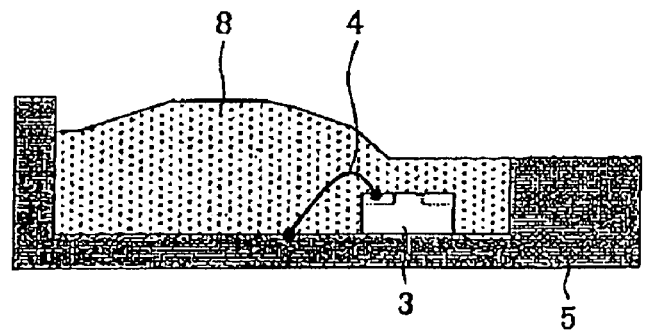
FIG. 28(c) is a side view showing the manufacturing process of the optical module shown in FIG. 27.
Figure 28D:
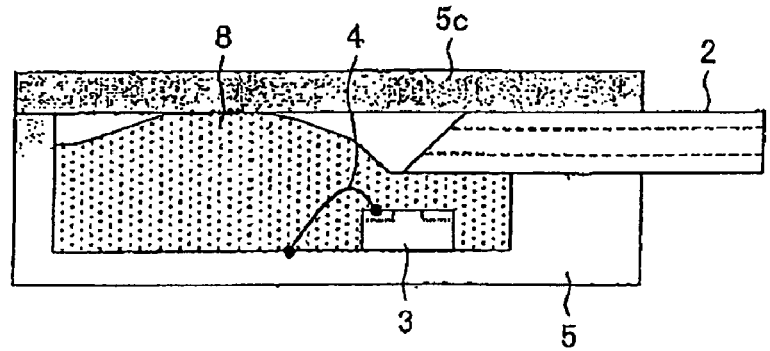
FIG. 28(d) is a side view showing the manufacturing process of the optical module shown in FIG. 27.

FIG. 27 is a side view showing a schematic configuration of the optical module 1 when the interior of the package 5 is filled with the sealant 8. The manufacturing method thereof will be described using FIG. 28(*a*) to FIG. 28(*d*).

First, a shaping member 9 having the same shape as the optical waveguide 2 is aligned with the light receiving/emitting element and installed on the opened surface 5*a* of the package 5 (FIG. 28(*a*)). The resin sealant 8 is then injected and hardened inside the package 5 (FIG. 28(*b*)). The shaping member 9 is removed (FIG. 28(*c*)), and the optical waveguide 2 and the lid 5*c*, which are adhered and fixed and integrated in advance, are adhered and fixed to the opened surface 5*a* of the package 5. Thus, the entrance/exit port 2*c* of the optical waveguide 2 can be supported with the sealant, and the end of the optical waveguide 2 can be more reliably supported.

Figure 21:
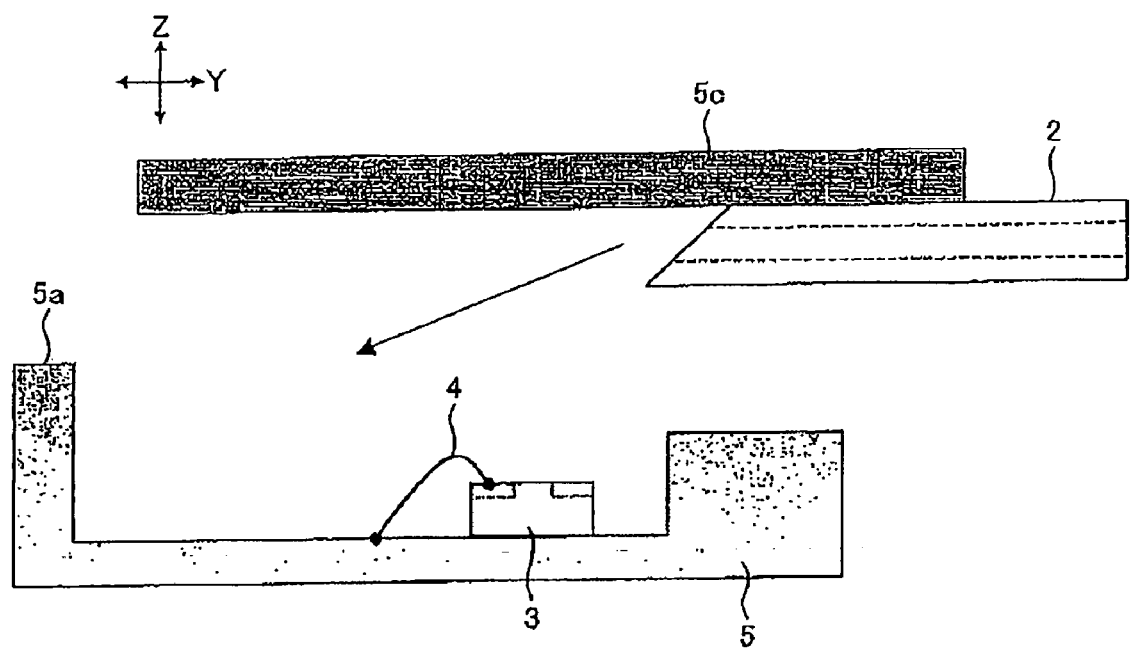
FIG. 21 is a side view showing a manufacturing method of the optical module shown in FIG. 20.

A small-diameter hole for injecting the sealant 8 into the closed package 5 may be formed in the lid 5*c* by the method shown in FIG. 21 without using the shaping member 9.

In the present embodiment, there may be adopted a configuration in which the optical waveguide 2, the package 5, and the lid 5*c* are adhered and fixed with the adhesive, but the adhering method is not limited thereto, and adhering by adhesive sheet, heat-seal, UV fusion, and the like.

In the present embodiment, the optical waveguide 2 is supported while surface contacting with the supporting part such as the opened surface 5*a*, the lid 5*c*, and the supporting column 6, but is not limited thereto, and may be supported by point contacting or line contacting with the supporting part.

Figure 29A:
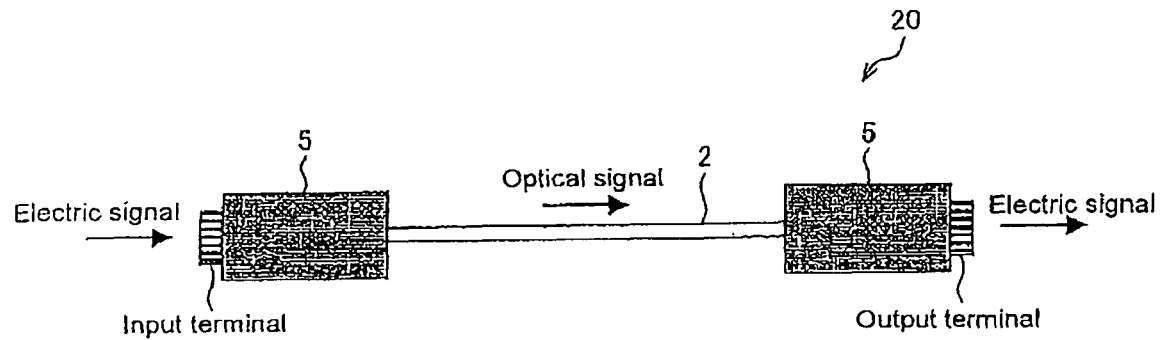
FIG. 29(a) is a top view showing a configuration example of an optical wiring module applied with the optical module of the present embodiment.
Figure 29B:
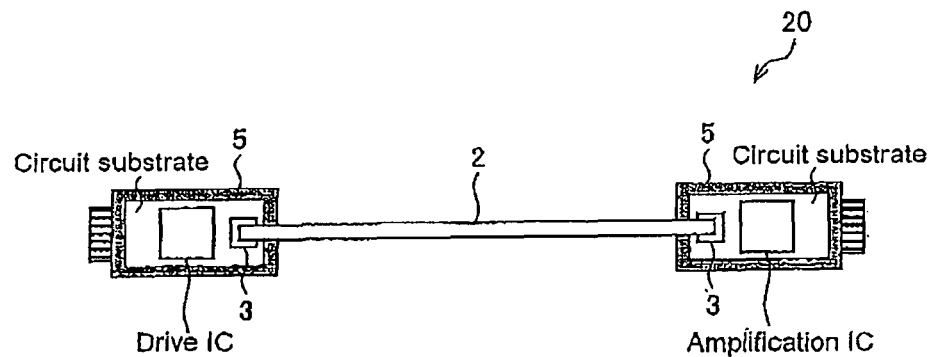
FIG. 29(b) is a top view showing a configuration example of the interior of the package in the optical wiring module shown in FIG. 29(a).
Figure 29C:
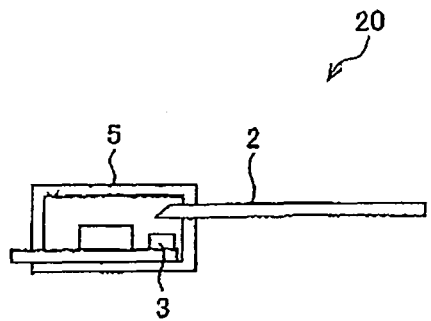
FIG. 29(c) is a cross-sectional view showing a configuration example of the interior of the package in the optical wiring module shown in FIG. 29(a).
Figure 30:
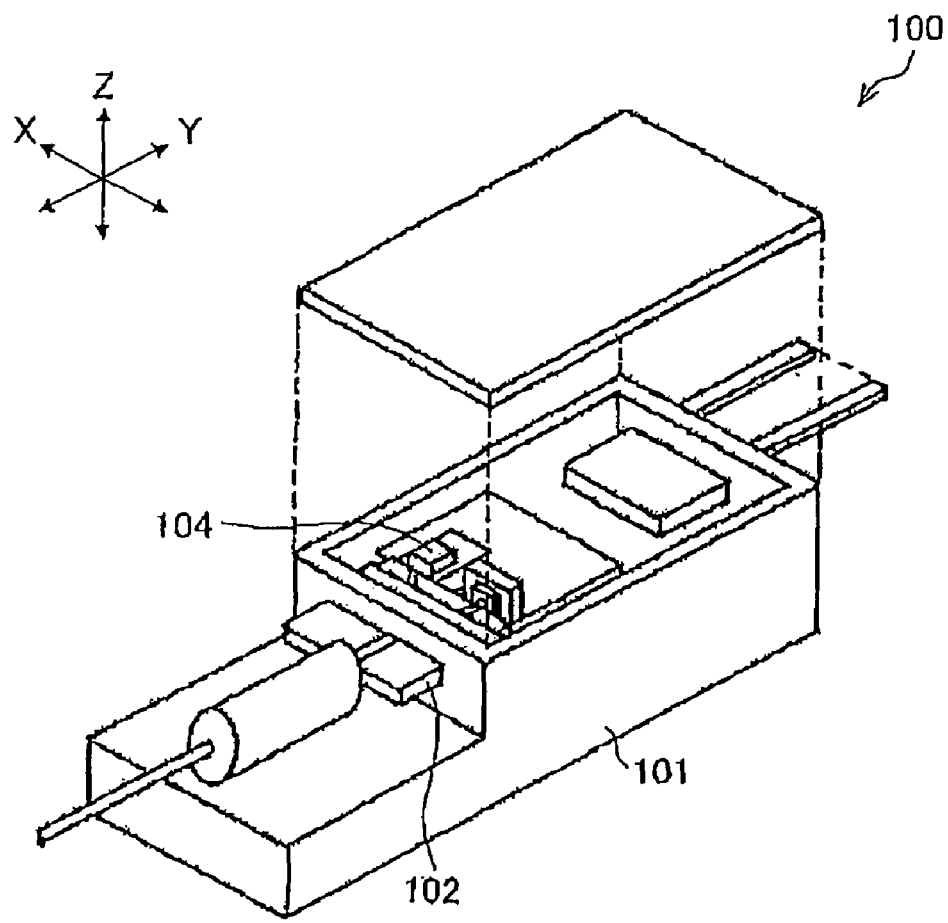
FIG. 30 is a perspective view showing a schematic configuration of a conventional optical module.
Figure 31:
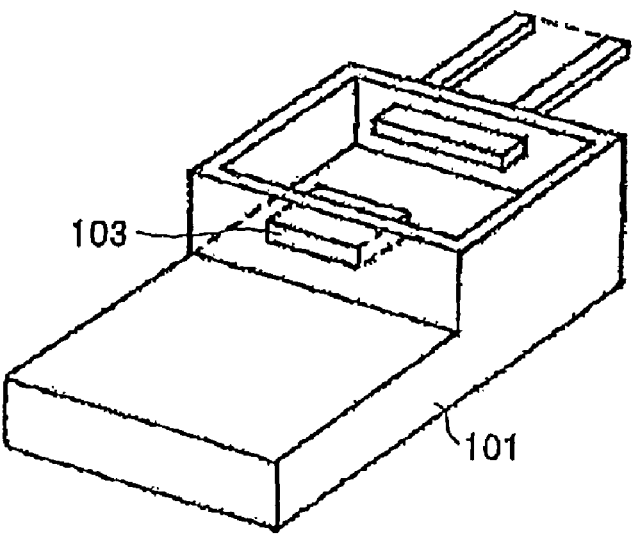
FIG. 31 is a perspective view showing a schematic configuration of a package in the optical module shown in FIG. 30.

A configuration example in which the optical module 1 according to the present embodiment is applied as an optical wiring module is shown in FIG. 29(*a*) to FIG. 29(*c*).

As shown in the figure, the optical wiring module 20 is configured by the optical module 1 with the optical waveguide 2, the light receiving/emitting element 3, and the package 5 for accommodating the optical waveguide 2 and the light receiving/emitting element 3; and a circuit substrate mounted with the light receiving/emitting element 3, the drive IC for driving the light emission of the light emitting element 3, and an amplification IC for amplifying the optical signal received by the light receiving element 3 as an electric signal.

This configuration realizes an optical wiring module suppressed with fluctuation of optical coupling efficiency capable of being mounted in a small and thin commercial-off-the-shelf equipment.

Therefore, in the optical module of the present invention, the package may be formed to a concave shape by the side walls raised from the bottom plate, where the side wall for supporting the above-described second region traversing the optical waveguide in the package and the side wall for supporting the first region in a direction opposite to the traversing side wall become the supporting part.

According to the above configuration, the end of the optical waveguide is supported by the side wall traversing the optical waveguide in the package and the side wall in a direction different from the traversing side wall. Thus, the end of the optical waveguide can be supported in two directions, and thus the deformation of the end of the optical waveguide can be suppressed.

In the above-described optical module, the package may be formed to a concave shape by the side walls raised from the bottom plate, where the side wall traversing the optical waveguide in the package becomes the supporting part, which side wall includes a groove part on the surface on a space side inside the package In the side wall so as to support both ends in a direction traversing the optical waveguide at the end of the optical waveguide.

Thus, both ends in the direction traversing the optical waveguide at the end of the optical waveguide can be supported, and the deformation of the end of the optical waveguide can be suppressed.

In the above-described optical module, the package may be formed to a concave shape by the side walls raised from the bottom plate, where the supporting column serving as the supporting part is arranged in the concave part, the end of the optical waveguide is supported by the side wall for supporting the second region traversing the optical waveguide and the supporting column for supporting the first region.

According to such configuration, the end of the optical waveguide is supported by the supporting column arranged in the package and the side wall traversing the optical waveguide. Thus, the end of the optical waveguide can be supported in two or more directions, and thus the deformation of the end of the optical waveguide can be more reliably suppressed.

In the above-described optical module, the package may include a horseshoe shaped supporting column serving as the supporting part, where the end of the optical waveguide is supported by the horseshoe shaped supporting column so as to support a longitudinal direction of the optical waveguide at the end of the optical waveguide in the second region, and support a direction orthogonal to a longitudinal direction in the first region.

According to such configuration, the end of the optical waveguide is supported in the longitudinal direction of the optical waveguide at the end and the direction orthogonal to the longitudinal direction. Thus, the end of the optical waveguide can be supported at the respective sides of the horseshoe shaped supporting column, that is, in three directions, and thus the deformation that occurs at the end of the optical waveguide can be more reliably suppressed.

In the above-described optical module, the package may be formed to a concave shape by the sides raised from the bottom plate, where a lid for closing the space inside the package is arranged contacting the opened surface of the concave part, the end of the optical waveguide is adhered and fixed to the lid, and the side wall traversing the optical waveguide and the lid serve as the supporting part.

According to such configuration, the end of the optical waveguide is supported by the lid for adhering and fixing the end and the side wall of the package. Thus, the end of the optical waveguide On be supported in at least two directions of a first surface at the end of the optical waveguide and a second surface opposite to the first surface, and thus deformation that occurs at the end of the optical waveguide can be suppressed.

In the above-described module, the sealant may be filled inside the package.

Since the sealant is filled inside the package, the end of the optical waveguide can be reliably supported, and the deformation that occurs at the end of the optical waveguide can be suppressed. Furthermore, since the optical elements are also reliably fixed by the sealant, the distance between the optical element and the entrance/exit port of the optical signal at the end of the optical waveguide and the position relationship thereof can be maintained constant. The fluctuation of the optical coupling efficiency therefore can be suppressed.

In the above-described optical module, the package may have a configuration of further accommodating electronic components, where the electronic components are arranged in the package so that the projecting region to the bottom plate of the package of the optical waveguide forms in a region between the electronic component and the supporting part.

In the above-described optical module, the supporting part may be a member which shields light.

Specific embodiments and examples described in the section of Best Mode for Carrying out the Invention are merely provided to clarify the technical contents of the present invention, and should not be construed in a narrow sense as being limited to the specific examples, where various modifications can be implemented within the spirit and the scope of the accompanied matters described hereinafter of the present invention.

INDUSTRIAL APPLICABILITY

As optical transmission by a flexible optical cable is realized, it can be applied as portable telephone, laptop, PDA (Personal Digital Assistance), liquid crystal TV, desk top monitor, printer, in-vehicle electric equipments, server, router, test machine, and other inter-substrate data transmission cable of commercial-off-to-shelf equipments and general purpose equipments.

The invention claimed is:

1. An optical module comprising:
    an optical element for transmitting or receiving an optical signal,
    an optical waveguide having a core part made of a material with translucency and a clad part made of a material having an index of refraction different from an index of refraction of the core part for optically coupling with the optical element and transmitting the optical signal, and
    a package for accommodating at least one end of the optical waveguide including an entrance/exit port of the optical signal and the optical element;
    wherein the package is formed to a concave shape by side walls rising from a bottom plate mounted with the optical element;
    wherein a surface of said end of the optical waveguide facing the bottom plate is configured by a first region including the entrance/exit port and a second region different from the first region;
    wherein the second region is the region of the optical waveguide that is supported by a first side wall as one of the side walls rising from the bottom plate;
    wherein the package includes a supporting part;
    wherein the supporting part comprises:
        the first side wall supporting one part of at least two sides of the second region traversing the optical waveguide in the package; and a second side wall as another one of the side walls supporting one part of at least a side of the first region in a direction different from the first side wall; and
    wherein the supporting part is a member which shields light.

2. The optical module according to claim 1, wherein
    the package includes a supporting column that becomes the supporting part in the concave part; and
        the end of the optical waveguide is supported by a side wall supporting the second region traversing the optical waveguide and the supporting column supporting the first region.

3. The optical module according to claim 2,
    wherein the package includes a lid for closing the space inside the package by contacting an opened surface of the concave part;
    the end of the optical waveguide is adhered and fixed to the lid; and
    a side wall traversing the optical waveguide and the lid become the supporting part.

4. The optical module according to claim 3, wherein the interior of the package is filled with sealant.

5. The optical module according to claim 2, wherein the interior of the package is filled with sealant.

6. The optical module according to claim 1, wherein
    the package is includes a lid for closing the space inside the package by contacting an opened surface of the concave part;
    the end of the optical waveguide is adhered and fixed to the lid; and
    a side wall traversing the optical waveguide and the lid become the supporting part.

7. The optical module according to claim 6, wherein the interior of the package is filled with sealant.

8. The optical module according to claim 1, wherein
    the package further accommodates electronic components; and
    the electronic component is arranged in the package so that a projection region to the bottom plate of the package of the optical waveguide is formed in a region between the electronic component and the supporting part.

9. The optical module according to claim 8, wherein the interior of the package is filled with sealant.

10. The optical module according to claim 1, wherein the interior of the package is filled with sealant.

* * * * *